(12) United States Patent
Kim et al.

(10) Patent No.: US 8,060,457 B2
(45) Date of Patent: Nov. 15, 2011

(54) SYSTEMS AND METHODS FOR ELECTROMAGNETIC BAND GAP STRUCTURE SYNTHESIS

(75) Inventors: Tae Hong Kim, Tucker, GA (US); Ege Engin, Atlanta, GA (US); Madhavan Swaminathan, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1010 days.

(21) Appl. No.: 11/854,997

(22) Filed: Sep. 13, 2007

(65) Prior Publication Data
US 2008/0091389 A1    Apr. 17, 2008

Related U.S. Application Data

(60) Provisional application No. 60/844,250, filed on Sep. 13, 2006.

(51) Int. Cl.
*G06F 15/18* (2006.01)
*G06N 3/00* (2006.01)
*G06N 3/12* (2006.01)

(52) U.S. Cl. ............................... 706/13; 706/12; 706/14

(58) Field of Classification Search .................. None
See application file for complete search history.

(56) References Cited

U.S. PATENT DOCUMENTS

| | | | |
|---|---|---|---|
| 5,471,180 A | | 11/1995 | Brommer et al. |
| 5,719,794 A | * | 2/1998 | Altshuler et al. ................ 703/1 |
| 5,739,796 A | | 4/1998 | Jasper, Jr. et al. |
| 5,990,850 A | | 11/1999 | Brown et al. |
| 6,933,812 B2 | | 8/2005 | Sarabandi et al. |
| 6,965,345 B2 | * | 11/2005 | Bae et al. ............... 343/700 MS |
| 7,042,419 B2 | * | 5/2006 | Werner et al. ................. 343/909 |
| 7,151,506 B2 | * | 12/2006 | Knowles et al. .............. 343/909 |
| 7,209,082 B2 | * | 4/2007 | Waltho .................... 343/700 MS |
| 7,215,301 B2 | * | 5/2007 | Choi et al. .................... 343/909 |
| 7,253,788 B2 | * | 8/2007 | Choi et al. .................... 343/909 |

(Continued)

OTHER PUBLICATIONS

Kim et al. "A Genetic Algorithm Based Inverse Band Structure Method for Semiconductor Alloys", Journal of Computational Physics, 2005, pp. 735-760.*

(Continued)

*Primary Examiner* — Omar Fernandez Rivas
(74) *Attorney, Agent, or Firm* — Ryan A. Schneider, Esq.; Trenton A. Ward, Esq.; Troutman Sanders LLP

(57) ABSTRACT

The present invention describes methods and apparatus for electromagnetic band gap structure synthesis. An exemplary embodiment of the present invention provides a method of electromagnetic band gap structure synthesis, which includes the step of providing a set of desired characteristics for an electromagnetic band gap structure. Furthermore, the method includes generating populations of patch shape members with a genetic algorithm routine and solving one or more of patch shape members of the populations with an electrodynamics modeling technique. Thereafter, the method includes the step of converting the output of the electrodynamics modeling technique into a set of response data for one or more of the patch shape members and calculating a fitness level for one or more of the sets of response data in comparison to the set of desired characteristics for the electromagnetic band gap structure. Next, the method includes the step of determining whether the fitness level of one of the patch shape members is within a predetermined tolerance. Subsequently, if none of the patch shape members provides a fitness level within the predetermined tolerance, then the steps of generating, solving, converting, calculating, and determining are repeated.

19 Claims, 23 Drawing Sheets

U.S. PATENT DOCUMENTS

| | | | | |
|---|---|---|---|---|
| 7,256,753 | B2* | 8/2007 | Werner et al. | 343/909 |
| 7,420,524 | B2* | 9/2008 | Werner et al. | 343/909 |
| 2004/0001021 | A1* | 1/2004 | Choo et al. | 343/700 MS |
| 2007/0224737 | A1* | 9/2007 | Berlin et al. | 438/141 |
| 2008/0091389 | A1* | 4/2008 | Kim et al. | 703/2 |

OTHER PUBLICATIONS

Kern et al., "Ultra-Thin Electromagnetic Bandgap Absorbers Synthesized Via Genetic Algorithms", IEEE, 2003, pp. 1119-1122.*

Kern et al. "A Genetic Algorithm Approach to the Design of Ultra-Thin Electromagnetic Bandgap Absorbers", Microwave and Optical Technology Letters, 2003, pp. 61-64.*

Gazonas et al. "Genetic Algorithm Optimization of Phonomic Bandgap Structures", International Journal of Solids and Structures, 2006, pp. 5851-5866.*

Jang et al. "Neuro-Fuzzy and Soft Computing", 1997, pp. 175-180.*

GEATbx, "Evolutionary Algorithms 3 Selection", www.geatbx.com/docu/algindex-02.html, 2005, pp. 1-15.*

Test & Measurement Application Note 95-1, "S-Parameter Techniques for Faster, More Accurate Network Design," Hewlett-Packard Company, 1997, 79 pages.

Choi, Jinwoo, "Noise Suppression and Isolation in Mixed-Signal Systems Using Alternating Impedance Electromagnetic Bandgap (AI-EBG) Structure)," Georgia Institute of Technology, May 2006, pp. 1-195.

Ramahi, Omar M. et al., "A Simple Finite-Difference Frequency-Domain (FDFD) Algorithm for Analysis of Switching noise in Printed Circuit Boards and packages," IEEE Trasactions on Advanced packaging, vol. 26, No. 2, 191-198, May 2003.

* cited by examiner

Fig. 11
One Dimensional EBG Structure
Synthesis 1 : 14mm x 14mm Unit Cell Size
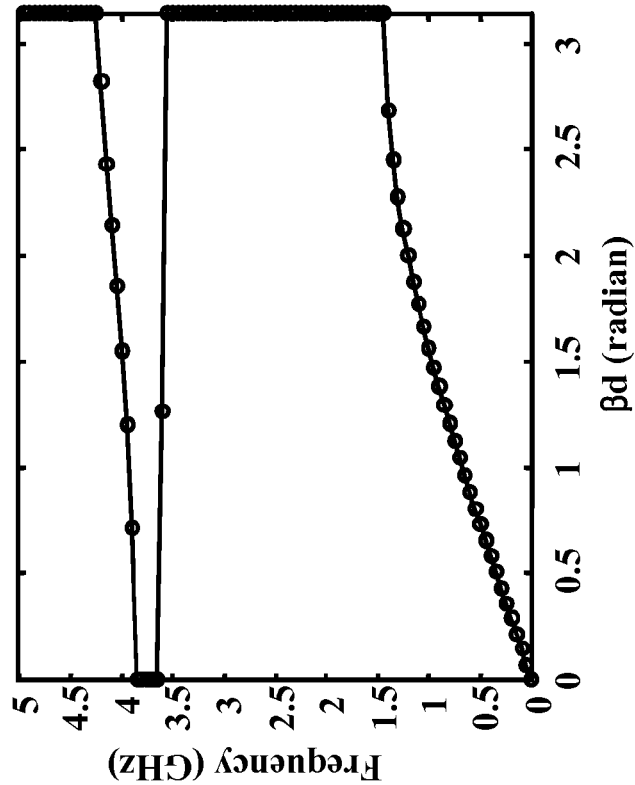
Dispersion Diagram verification of the synthesized one
On-set frequency input : 1.4GHz
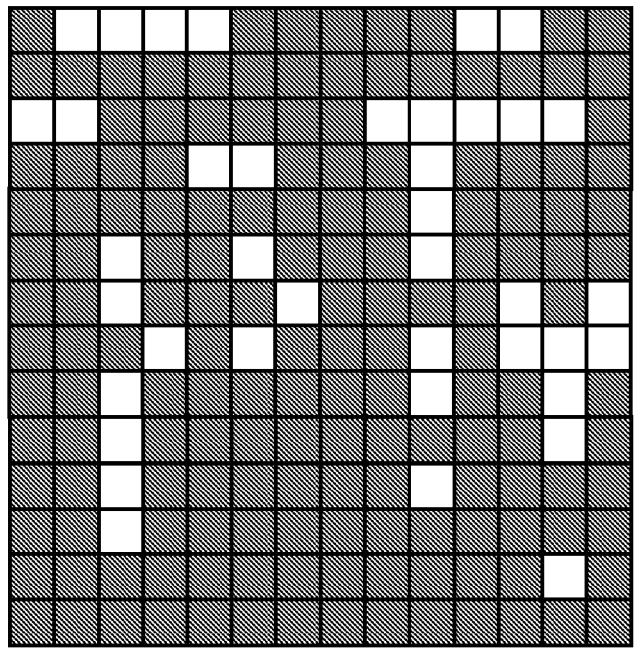
Synthesized EBG structure

Verification of The Synthesized EBG Structure

Fig. 13
One Dimensional EBG Structure
Synthesis 2 : 14mm x 14mm Unit Cell Size
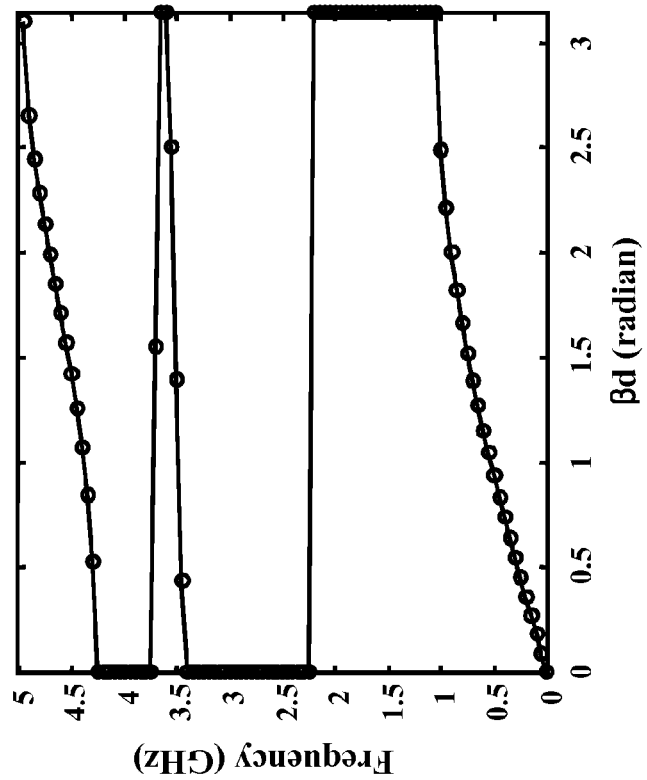
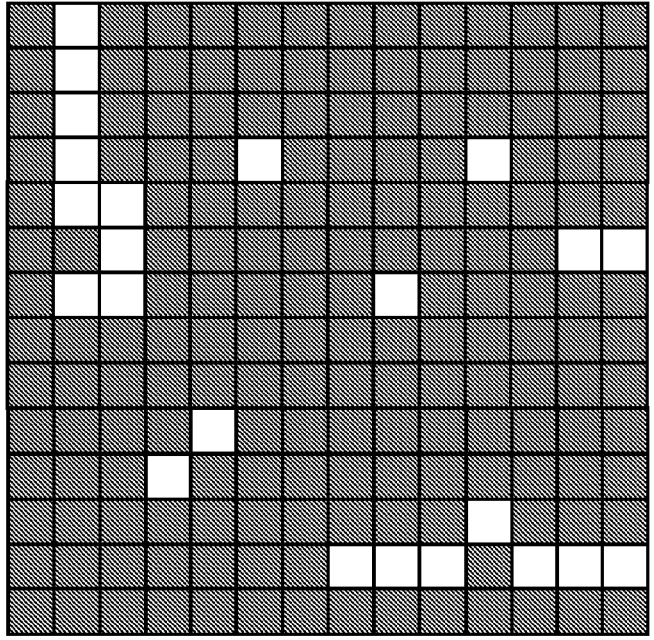

Fig. 14 Verification of The Synthesized EBG Structure

Fig. 15
One Dimensional EBG Structure
Synthesis 3 : 14mm x 14mm Unit Cell Size
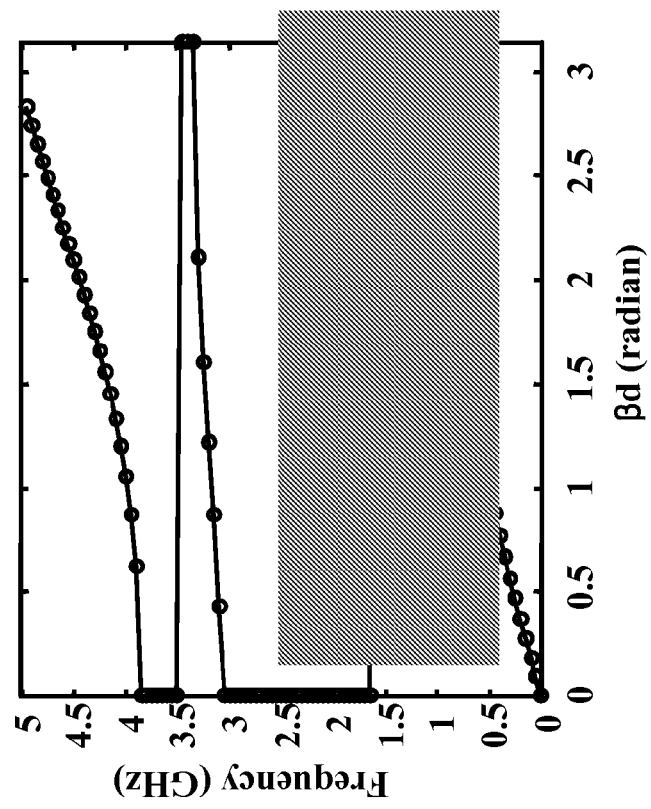
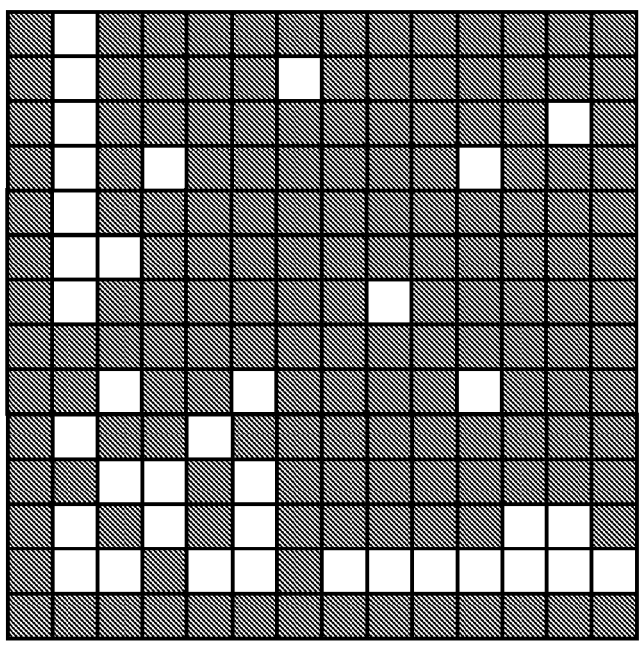

Verification of The Synthesized EBG Structure

Fig. 17
One Dimensional EBG Structure
Synthesis 4 : 14mm x 14mm Unit Cell Size
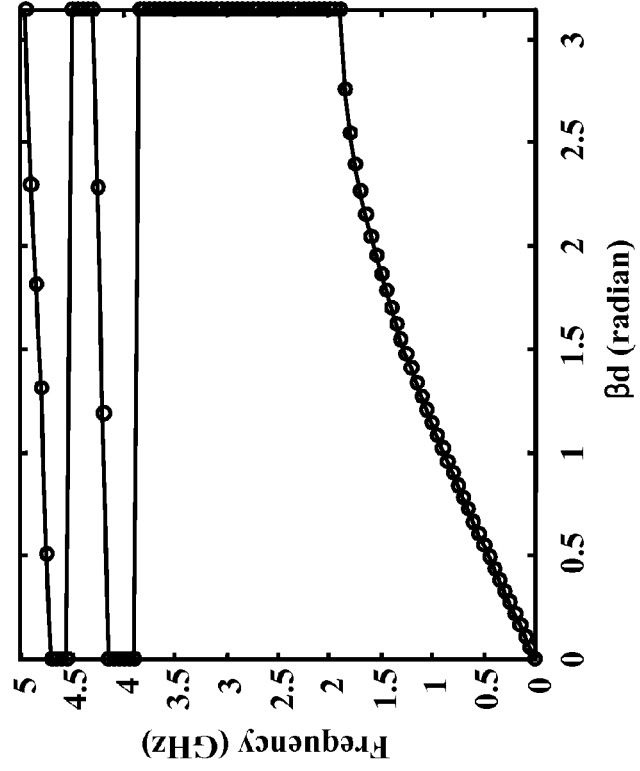
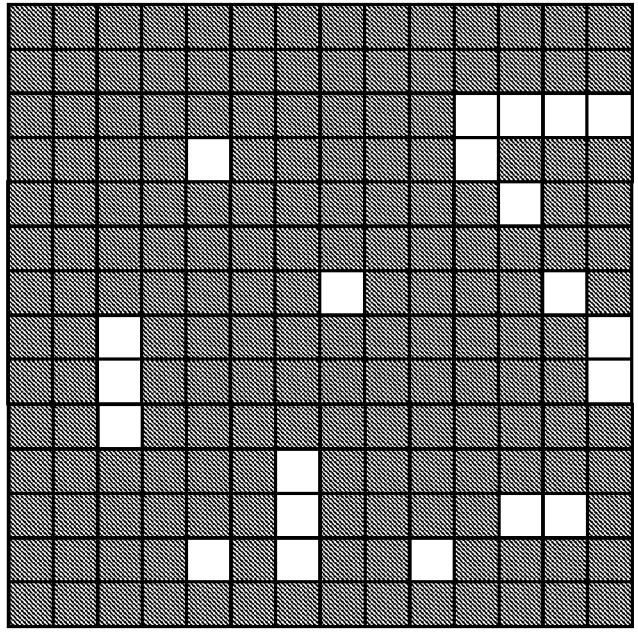

Verification of The Synthesized EBG Structure

One Dimensional EBG Structure
Synthesis 5 : 30mm x 30mm Unit Cell Size

Fig. 20 Verification of The Synthesized EBG Structure

One Dimensional EBG Structure
Synthesis 6 : 30mm x 30mm Unit Cell Size

Verification of The Synthesized EBG Structure

SYSTEMS AND METHODS FOR ELECTROMAGNETIC BAND GAP STRUCTURE SYNTHESIS

CROSS REFERENCE TO RELATED APPLICATION

This application claims the benefit of U.S. Provisional Application No. 60/844,250, filed 13 Sep. 2006, which is hereby incorporated by reference in its entirety as if fully set forth below.

FIELD OF THE INVENTION

This invention relates generally to the field of electromagnetic band gap structures, and specifically to systems and methods to efficiently and effectively synthesize electromagnetic band gap structures.

BACKGROUND OF THE INVENTION

Explosive developments in microelectronic processing speeds, chip densities, and transmission bandwidths have enabled many new advanced electronic devices. While these high-speed and highly compact devices have created new applications, the design and implementation of these devices have been significantly hindered by increased problems from noise and interference. Problems due to noise are especially limiting in devices having both analog circuits and digital circuits, otherwise known as mixed signal systems.

Mixed signal systems are used in numerous electronic devices, including wireless devices and other transceivers. For example, an ultra wide band (UWB) transceiver can be used with a mixed signal system, which transmits and receives data over a relatively high frequency band. FIG. 1 provides an illustration of a UWB transceiver 105 configured on the same board as digital circuits. As shown in FIG. 1, the modulator 110 and demodulator 115 are configured to either receive input from, or output data to, the digital circuitry resident on the same board as the UWB transceiver 105. The low-noise amplifier (LNA) 120 of the UWB transceiver 105 is extremely sensitive to noise as it is located at the front-end of the demodulator and used to detect low power signals. More particularly, the LNA 120 is sensitive to noise spikes generated by the digital circuits in or close to the operating frequency of the UWB transceiver 105. Therefore, noise spikes from the digital circuits have the capability of de-sensitizing the UWB transceiver 105 and compromising the functionality of the UWB transceiver 105.

The need for noise suppression to preserve the precision and functionality of the mixed signal system containing the UWB transceiver 105 shown in FIG. 1 is just one example of the desire for noise suppression in many electronic applications. An additional example can be found in systems using both analog-to-digital converters (ADCs) and digital-to-analog converters (DACs), components contained in the majority of wireless transmission devices. DACs convert complex digital signals for analog transmission and ADCs process complex analog signals for digital processing. To meet the needs of present and future-generation wireless systems, ADCs and DACs must perform at RF rates and with outstanding linearity. Therefore, the current trend for ADCs is towards obtaining high-speed and high resolution. This trend makes ADCs more sensitive to noise.

FIG. 2 provides a block diagram of the layout of a mixed signal wireless system 205 containing both analog and digital circuitry, including a series of ADCs 210 and 215 and DACs 220 and 225. As shown in FIG. 2, the analog components exist within the same layout as the digital components. As high-speed and high-resolution ADCs are highly sensitive, a noise spike from digital circuits can affect ADC performance. This high sensitivity has resulted in a significant reduction in the acceptable noise margins for the mixed signal wireless system 205. Therefore, many prior art devices implement measures that attempt to isolate the sensitive RF/analog circuits, such as those in wireless system 205, from the power and ground noise generated by the digital circuits.

One noise suppression technique used in the prior art is to split the power/ground plane by inserting a slot between the planes. The slot in the power/ground plane can partially block the propagation of power/ground noise. This prior art technique is ineffective for many applications, however, because a portion of the electromagnetic energy can still couple through the slot at high frequencies. Due to the electromagnetic coupling, this method only provides a marginal isolation (i.e., −20 dB to −60 dB) at high frequencies (i.e., above 1 GHz) and becomes ineffective as the sensitivity of the RF circuit increases and the operating frequency of the system increases. At low frequencies (i.e., below 1 GHz), the split plane can provide an isolation of −70 dB to −80 dB.

In addition to the failure to be effective at high frequencies, prior art systems with split power/ground planes are ineffective for systems requiring the same DC power supply. As systems become more complex, multiple power supplies become a luxury a designer cannot afford. An alternative technique used in the prior art for systems requiring the same DC power supply is to use ferrite beads to attempt to suppress the power/ground noise. Ferrite beads are non-conductive ferrimagnetic ceramic compounds, which essentially act as a high impedance to high frequency EMI/RFI electronic noise. The absorbed energy is converted to heat and dissipated by the ferrite. Thus, ferrite beads can be included in the layout of the mixed signal systems using the same DC power supply for both the analog circuits and the digital circuits. Similar to the prior art technique of splitting the power/ground plane, however, the prior art technique of using ferrite beads for power/ground noise isolation is not effective at high frequencies. Therefore, as the operation frequencies of mixed signal systems increase, the need for a technique to adequately and efficiently suppress noise at these high frequencies also increases.

An alternative noise suppression technique involves the use of band gap structures. For example, photonic band gap structures are used for electromagnetic (EM) wave applications. Photonic band gap structures can have a two- or three-dimensional periodic array structure in which the propagation of EM waves is governed by band-structure types of dispersion relationships. These photonic band gap structures provide electromagnetic analogs to electron-wave behavior in crystals. Photonic band gap structures can also be formed with local disturbances in the periodic array structure, thereby generating defect or cavity modes with frequencies within a forbidden band gap, for use in forming high-Q resonators or filters.

Electromagnetic band gap structures are another type of band gap structure that have been implemented in many prior art devices in an attempt to combat error due to noise. Electromagnetic band gap structures are the microwave counterpart of the photonic band gap structure. Electromagnetic band gap structures have become very popular due to their advantageous applications for suppression of unwanted electromagnetic transmission and radiation in the area of microwave and millimeter waves. Electromagnetic band gap structures are periodic structures in which the propagation of electromagnetic waves is restricted in a specified frequency band.

Electromagnetic band gap structures can be used in a variety of applications. For example, electromagnetic band gap structures can enhance the performance of planar antennas by placing an electromagnetic band gap shield structure proximate to a microstrip patch. The inclusion of the electromagnetic band gap structure proximate a microstrip patch can improve the front to backward radiation ratio of the antenna. Additionally, an electromagnetic band gap structure can be incorporated as the ground plane for a rectangular microstrip antenna for enhanced performance. In filter applications, electromagnetic band gap substrates can be incorporated to achieve greater isolation. Furthermore, electromagnetic band gap structures have proven effective in isolating the power/ground noise in mixed signal systems. In fact, electromagnetic band gap structures have proven effective in isolating the power/ground noise even in systems that use the same DC power supply.

Despite the potential benefits of electromagnetic band gap structures, conventional implementation of these structures is costly and prohibitive. More particularly, the most popular method of electromagnetic band gap structure design in the prior art involves a manual process that is time consuming, computationally expensive, and unreliable. FIG. 3 provides a block diagram of the conventional manual process of electromagnetic band gap structure synthesis 305. The manual process involves devising a set of input specifications 310 for the electromagnetic band gap structure. A prototype electromagnetic band gap structure is then created in step 315 based on estimations in view of these input specifications. The prototype electromagnetic band gap structure is then solved 320, with either a circuit simulator or electromagnetic simulator. The solved results of the prototype electromagnetic band gap structure are then compared in step 325 with the input specifications to determine the sufficiency of the estimated prototype electromagnetic band gap structure. Should the prototype electromagnetic band gap structure be insufficient, the prototype electromagnetic band gap structure is modified 330 in accordance with the insufficiencies shown in the test. Thereafter the modified prototype electromagnetic band gap structure is solved 320 and the results are compared 325 with the input specifications. The process of modifying 330, solving 320, and comparing 325 are repeated until the electromagnetic band gap structure sufficiently complies with the input specifications 310 or no acceptable result is obtained.

The conventional manual method of electromagnetic band gap structure synthesis 305, shown in FIG. 3, suffers from many drawbacks. Significantly, the number of iterations required for the manual method of electromagnetic band gap structure synthesis 305 is often relatively large. Therefore, one must perform numerous iterations of the manual process to achieve a workable electromagnetic band gap structure. Additionally, there is no upper bound on the number of iterations required by the manual method. Furthermore, many input specification sets have no solution. Therefore, a designer implementing the manual method of electromagnetic band gap structure synthesis 305 may go through hundreds of iterations of the method without ever achieving a satisfactory electromagnetic band gap structure. The manual method of electromagnetic band gap structure synthesis 305 is computationally expensive and time consuming. Thus, while electromagnetic band gap structures have the potential to present many advantages in noise suppression applications, there is no method in the prior art that enables reliable and efficient synthesis of these electromagnetic band gap structures.

Therefore, it would be advantageous to provide an apparatus and method for efficiently and effectively synthesizing electromagnetic band gap structures.

Additionally, it would be advantageous to provide an apparatus and method to automatically synthesize an electromagnetic band gap structure.

Additionally, it would be advantageous to provide an apparatus and method to automatically determine when the synthesis of an electromagnetic band gap structure with a particular set of band gap parameters is not possible.

BRIEF SUMMARY OF THE INVENTION

The present invention describes methods and apparatus for electromagnetic band gap structure synthesis. An exemplary embodiment of the present invention provides a method of electromagnetic band gap structure synthesis, which includes the step of providing a set of desired characteristics for an electromagnetic band gap structure. Furthermore, the method includes generating populations of patch shape members with a genetic algorithm routine and solving one or more of patch shape members of the populations with an electrodynamics modeling technique. Thereafter, the method includes the step of converting the output of the electrodynamics modeling technique into a set of response data for one or more of the patch shape members and calculating a fitness level for one or more of the sets of response data in comparison to the set of desired characteristics for the electromagnetic band gap structure. Next, the method includes the step of determining whether the fitness level of one of the patch shape members is within a predetermined tolerance. Subsequently, if none of the patch shape members provides a fitness level within the predetermined tolerance, then the steps of generating, solving, converting, calculating, and determining are repeated.

These and other objects, features and advantages of the present invention will become more apparent upon reading the following specification in conjunction with the accompanying drawing figures.

BRIEF DESCRIPTION OF THE FIGURES

FIG. 11 is an illustration of a patch shape member for an electromagnetic band gap structure synthesized in accordance with an exemplary embodiment of the present invention and the corresponding dispersion diagram for the electromagnetic band gap structure layout.

FIG. 13 is an illustration of a patch shape member for an electromagnetic band gap structure synthesized in accordance with an exemplary embodiment of the present invention and the corresponding dispersion diagram for the electromagnetic band gap structure layout.

FIG. 15 is an illustration of a patch shape member for an electromagnetic band gap structure synthesized in accordance with an exemplary embodiment of the present invention and the corresponding dispersion diagram for the electromagnetic band gap structure layout.

FIG. 17 is an illustration of a patch shape member for an electromagnetic band gap structure synthesized in accordance with an exemplary embodiment of the present invention and the corresponding dispersion diagram for the electromagnetic band gap structure layout.

DETAILED DESCRIPTION OF PREFERRED EMBODIMENTS

Figure 1:
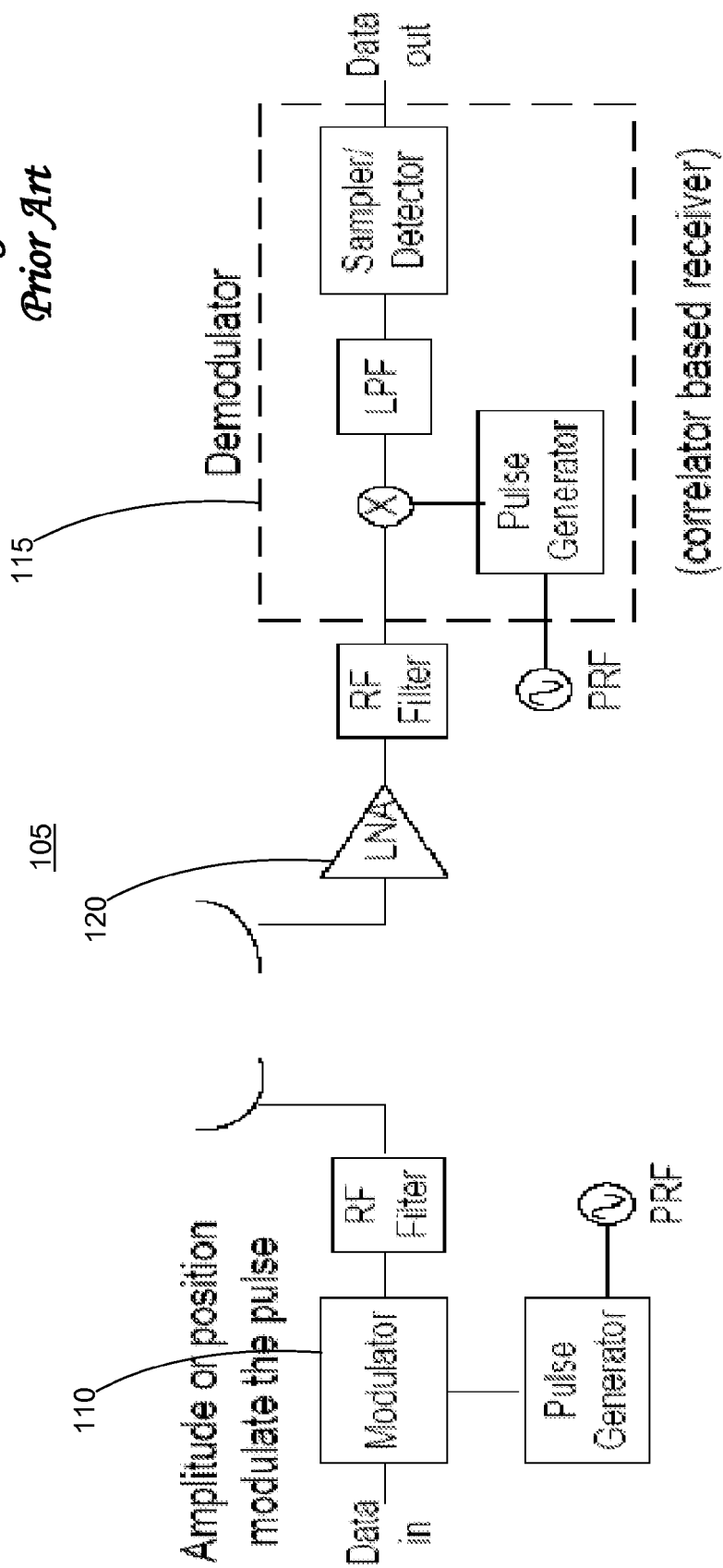
FIG. 1 provides an illustration of a UWB transceiver 105 configured on the same board as digital circuits.
Figure 2:
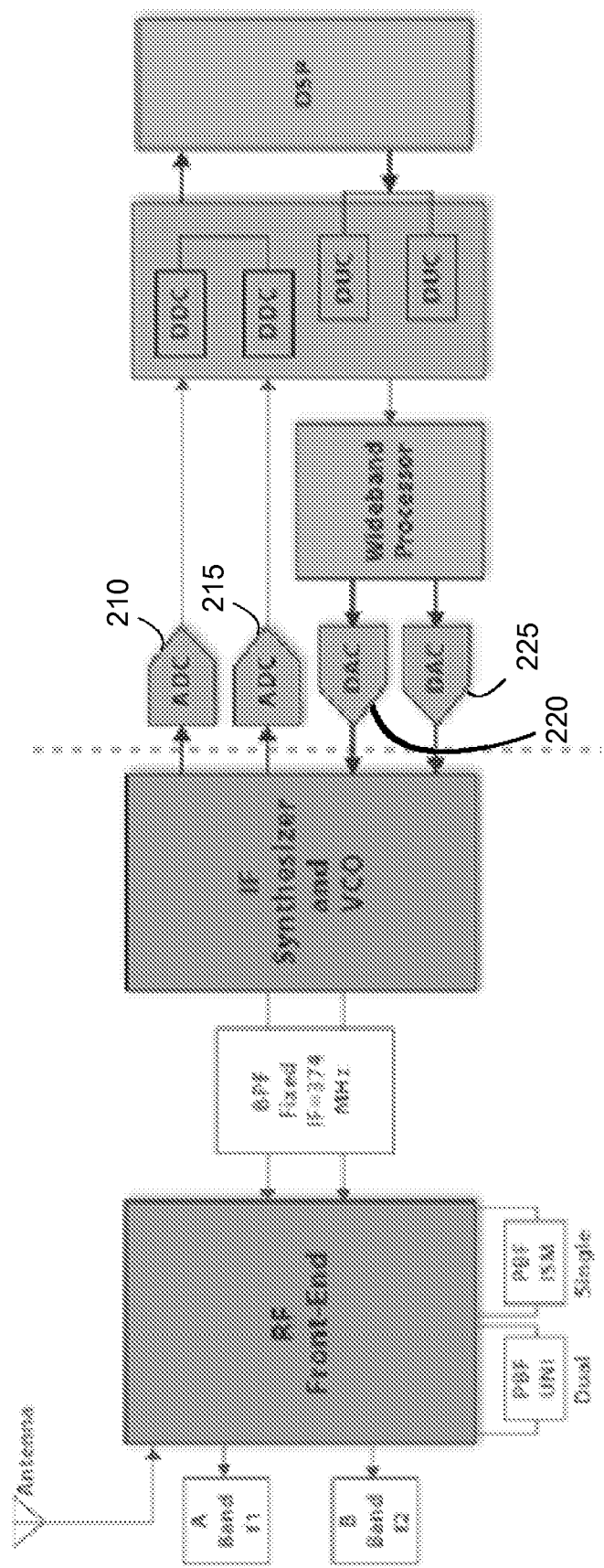
FIG. 2 provides a block diagram of the layout of a mixed signal wireless system 205 containing both analog and digital circuitry, including a series of ADCs 210 and 215 and DACs 220 and 225.
Figure 3:
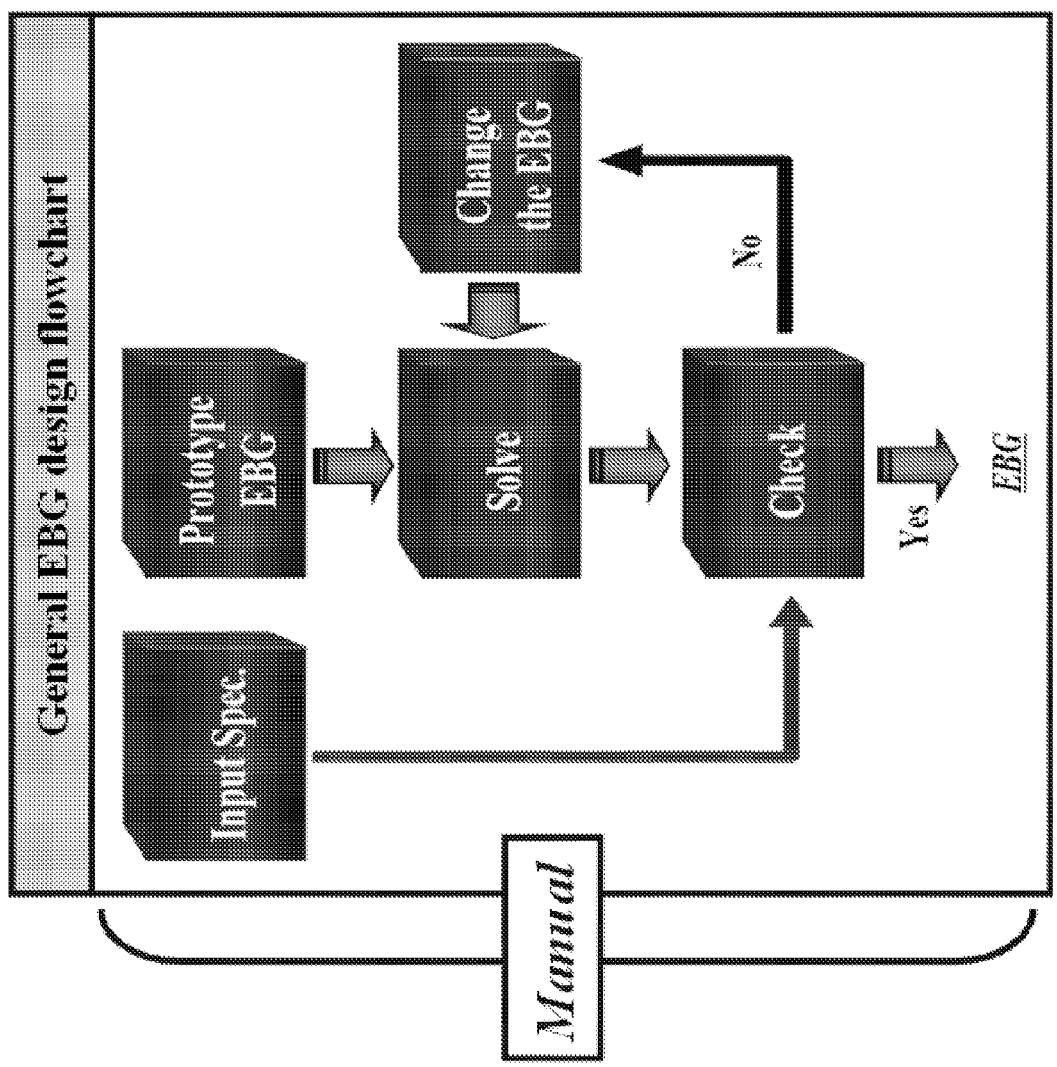
FIG. 3 provides a block diagram of the conventional manual process of electromagnetic band gap structure synthesis 305.

The present invention addresses the drawbacks of conventional systems and methods of electromagnetic band gap structure synthesis. Significantly, the present invention provides methods and apparatus for efficient and effective electromagnetic band gap structure synthesis. An electromagnetic band gap structure provided in accordance with the present invention is enabled to be accurately and conveniently configured to provide a required isolation level in a predetermined stop band. Additionally, the present invention overcomes the drawbacks of the manual methods in the prior art and provides systems and methods to automatically synthesize electromagnetic band gap structures.

In an exemplary embodiment, the present invention provides a method of electromagnetic band gap structure synthesis. The method includes the step of providing a set of desired characteristics for an electromagnetic band gap structure. Furthermore, the method includes generating populations of patch shape members with a genetic algorithm routine and solving one or more of patch shape members of the populations with an electrodynamics modeling technique. Thereafter, the method includes the step of converting the output of the electrodynamics modeling technique into a set of response data for one or more of the patch shape members and calculating a fitness level for one or more of the sets of response data in comparison to the set of desired characteristics for the electromagnetic band gap structure. Next, the method includes the step of determining whether the fitness level of one of the patch shape members is within a predetermined tolerance. Subsequently, if none of the patch shape members provides a fitness level within the predetermined tolerance, then the steps of generating, solving, converting, calculating, and determining are repeated.

The systems and methods of the present invention present many advantages over the prior art. Although electromagnetic band gap structures present many significant benefits to electronic device design, no method or systems exists in the prior art by which to reliably and conveniently synthesize these electromagnetic band gap structures. The manual methods existing in the prior art are uncertain, computationally expensive, and time consuming. While the electromagnetic band gap structures may be superior to other noise suppression devices, the burden required to achieve an optimized electromagnetic band gap structure is often insurmountable. Significantly, the systems and methods of the present invention will enable a completely automatic synthesis of an electromagnetic band gap structure. More particularly, the systems and methods of the present invention will allow a user to provide a set of desired characteristics for the electromagnetic band gap structure, including (1) on-set frequency of the band gap, the (2) offset frequency of the band gap, and the (3) isolation level, and receive, as the output the design, for an electromagnetic band gap structure corresponding to those desired characteristics.

Figure 4:
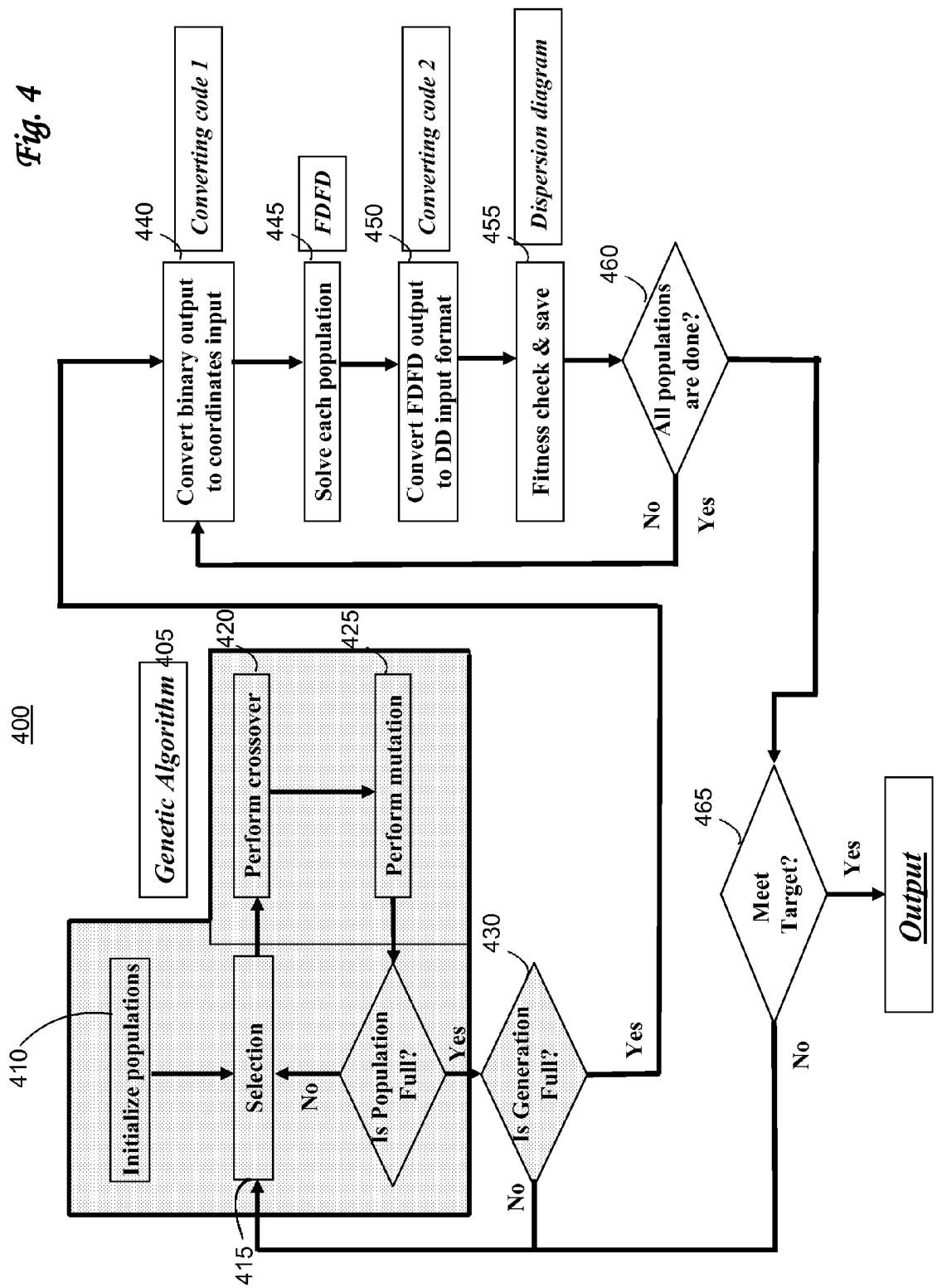
FIG. 4 provides an illustration of a block diagram of the method of electromagnetic band gap structure synthesis 400 in accordance with an exemplary embodiment of the present invention.

FIG. 4 provides an illustration of a block diagram of the method of electromagnetic band gap structure synthesis 400 in accordance with an exemplary embodiment of the present invention. As shown in FIG. 4, the method of electromagnetic band gap structure synthesis 400 relies upon a genetic algorithm 405 to perform a portion of the electromagnetic band gap structure synthesis.

Genetic algorithms, such as genetic algorithm 405, are adaptive heuristic search algorithms that use techniques inspired by evolutionary biology such as inheritance, mutation, selection, and crossover. In general terms, genetic algorithms rely on an intelligent but random search within a defined space to seek a solution. The evolution usually starts from a population of randomly generated members and occurs in successive generations. In each generation, the fitness of every member in the population is evaluated, multiple members are stochastically selected from the current population (based on their fitness), and modified (recombined and possibly randomly mutated) to form a new population. The new population is then used in the next iteration of the algorithm. Genetic algorithms can be characterized by representing a solution as a vector of digital symbols. The initial population can be created at random or from some known starting point. Typically, populations contain trial solutions, each of which is evaluated for fitness, and a new generation is created from the populations having a better fitness. The general genetic algorithm is continued through a number of generations and is terminated when a satisfactory fitness level has been achieved for a population or it is determined that no acceptable solution is possible. In the exemplary embodiment method of electromagnetic band gap structure synthesis 400 shown in FIG. 4, the genetic algorithm 405 is used in each iteration of the method 400 to create a new generation of populations of patch shape members for an electromagnetic band gap structure.

The method of electromagnetic band gap structure synthesis 400, shown in FIG. 4, is performed in view of a set of desired characteristics for an electromagnetic band gap structure. The set of desired characteristics provide the boundaries for an acceptable solution from the genetic algorithm 405. The set of desired characteristics are part of an overall set of input parameters that provide the rules by which the method of electromagnetic band gap structure synthesis 400 will be executed. In an exemplary embodiment, the input parameters include the cell size, the initial population number, the frequency range of the evaluation, the loss tangent, the dielectric constant, the dielectric thickness, and the set of desired characteristics for the electromagnetic band gap structure, which can include the (1) on-set frequency of the band gap, the (2) offset frequency of the band gap, and the (3) isolation level. In an alternative embodiment, the input parameters also include the conductor thickness, conductivity, a patch size, and a branch size. Furthermore, the set of desired characteristics for the electromagnetic band gap structure can be modified to include or delete certain noise suppression parameters.

The method of electromagnetic band gap structure synthesis 400 first involves the step of initializing the populations 410 of the genetic algorithm 405 with a group of patch shape members for each population. The number of populations chosen to be initialized is implementation specific and can based upon individual parameters of the synthesis method 400 or the desired electromagnetic band gap structure. For some embodiments, the number of populations initialized can range from 4 to 30 populations. In an exemplary embodiment, 10 populations are initialized in step 410. In an exemplary embodiment of the method of electromagnetic band gap structure synthesis 400, the populations are initialized with the most reliable set of patch shape members consisting of a solid patch array. As randomly generated genes may result in a discontinuous patch shape member, it is preferable in the exemplary embodiment of the method of electromagnetic band gap structure synthesis 400 to begin with entirely filled patch shape members. Those of skill in the art will appreciate that the populations can be initialized in a variety of different ways, including a random initialization.

Once the populations have been initialized 410, the step of selection 415 can be performed on the patch shape members of each population. The step of selection 415 involves selecting a portion of an existing population to breed a new generation. In an exemplary embodiment, individual solutions are selected through a fitness-based process where more fit solutions are more likely to be selected. In an exemplary embodiment, the step of selection 415 involves choosing the best 50% of the members of a population for a next generation. Those of skill in the art will appreciate that numerous different selection techniques can be employed for the step of selection 415.

Once the patch shape members of the population have been selected, the step of crossover 420 can be performed. In an exemplary embodiment, the step of crossover 420 constitutes a genetic operator in which the programming of the patch shape members of each population is varied. Those of skill in the art will appreciate that a variety of different crossover techniques can be implemented by the step of crossover 420, including one-point crossover, two-point crossover, cut and splice, uniform crossover, and half uniform crossover. In an exemplary embodiment, the step of crossover 420 relies on a two-point crossover technique with three chromosomes.

After the step of crossover 420, the step of mutation 425 can be performed on the children members of the parent population. In an exemplary embodiment, the step of mutation 425 involves the use of a genetic operator to maintain genetic diversity from one generation of a population to the next. In an exemplary embodiment, the mutation operator used in step 425 involves a 10% fixed mutation. The percent of mutation can vary with the number of populations initialized and with other parameters of the synthesis method 400. Those of skill in the art will appreciate that a variety of different mutation techniques can be employed to carry out the step of mutation 425. Once each patch shape member of a population has been determined, selection can begin for the next population. After selection 415, crossover 420, and mutation 425 have been performed on each patch shape member of a population, conditional step 430 is executed to determine whether all populations for a generation have been modified by the genetic algorithm 405. The genetic algorithm will perform selection, crossover, and mutation on every population until conditional step 430 is satisfied and a new generation is full. Once every population has been modified and the generation is full, thus satisfying conditional step 430, the full generation of new populations can be output from the genetic algorithm 405.

After the genetic algorithm 405 has generated a full generation of populations, the step of converting binary output 440 can be employed to convert the binary sequences of patch shape members into a set of coordinates for each patch shape member. Once converted, the step of solving 445 can be performed such that each patch shape member of each population is solved with an electrodynamics modeling technique. In the exemplary embodiment depicted in FIG. 4, the finite-difference frequency domain (FDFD) method is the electrodynamics modeling technique used to solve each patch shape member of each population. Those of skill in the art will appreciate that numerous electrodynamics modeling techniques can be used, including the finite-difference time-domain (FDTD) and multilayer finite-difference (M-FDM) methods, and other types of modeling techniques. The electrodynamics modeling technique can generate a set of response data for each patch shape member. For the exemplary embodiment depicted FIG. 4, the set of response data is a set of impedance parameters, or Z parameters, generated by the FDFD method for each patch shape member. Those of skill in the art will appreciate that the response data can be a number of different types of data generated by various modeling techniques. The set of response data can be used to determine the fitness level of a particular patch shape member.

In the exemplary embodiment of the method of electromagnetic band gap structure synthesis 400 depicted in FIG. 4, the set of response data are converted into a dispersion diagram (DD) format in step 450. Once the step of conversion into DD format 450 is complete, the step of calculating a fitness level 455 can be performed on each patch shape member of each population. The fitness level of a particular patch shape member is defined by a comparison of the DD format of the set of response data for that particular patch shape member to the set of desired characteristics for the electromagnetic band gap structure. The closer a patch shape member is to meeting the set of desired characteristics, the better the fitness level.

Steps 440, 445, 450, 455 are repeated for each patch shape member of each population until all the populations are complete, thus satisfying conditional step 460. Once conditional step 460 is satisfied (all populations have been evaluated), a determination can be made at conditional step 465 as to whether any of the patch shape members of the population have a fitness level within a predetermined threshold. If a particular patch shape member has a sufficient fitness level, then that patch shape member can be chosen as the solution patch shape member and the method 400 can be terminated. If none of the patch shape members succeed in providing a fitness level within the predetermined tolerance amount (and condition step 465 is not satisfied), then the genetic algorithm 405 can be re-executed, using the existing populations, to create a new generation for evaluation. In other words, the existing populations can be reinserted into the selection step 415 of the genetic algorithm 405, and a new generation can be created. The process can be iteratively repeated until one or more patch shape members is found with a sufficient fitness level. In an exemplary embodiment, if more than one patch shape members are found with a sufficient fitness level, then the patch shape member with the best fitness level can be chosen.

Figure 5:
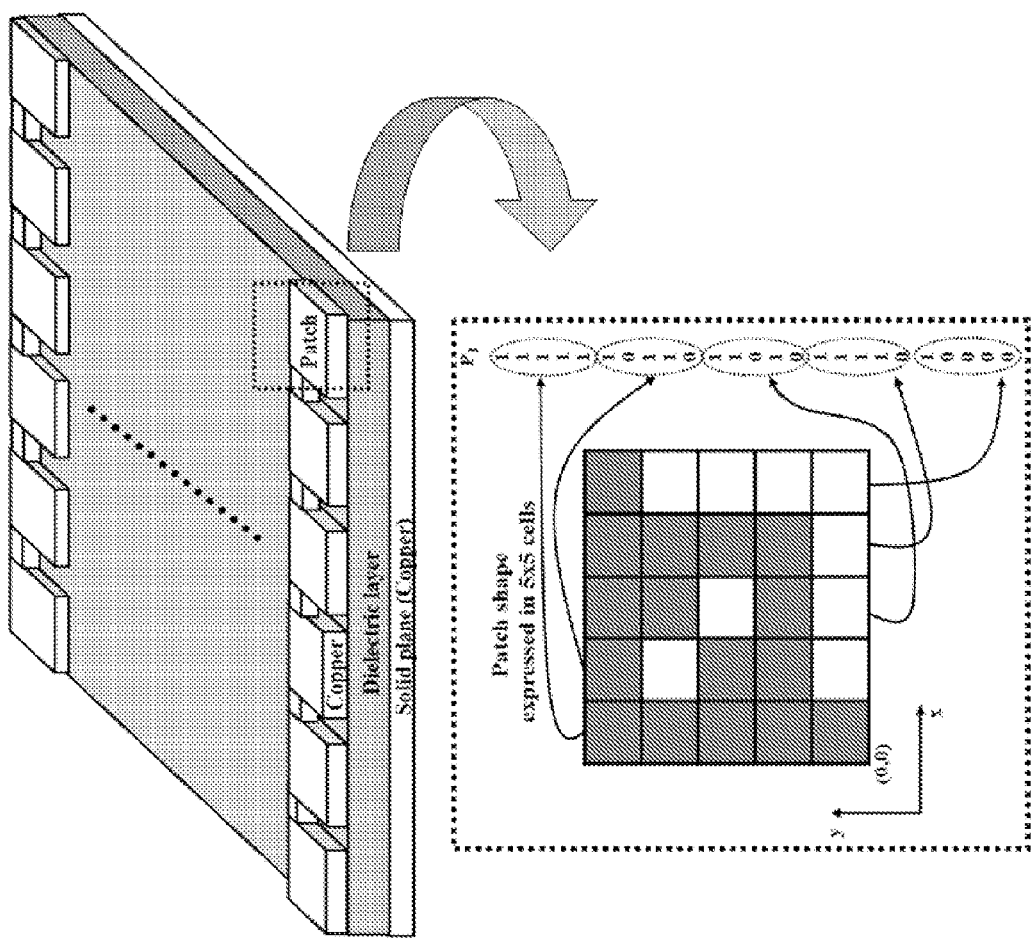
FIG. 5 provides an illustration of electromagnetic band gap structure 500 in accordance with an exemplary embodiment of the present invention.

FIG. 5 provides an illustration of electromagnetic band gap structure 500 in accordance with an exemplary embodiment of the present invention. As shown in FIG. 5, the electromagnetic band gap structure 500 can have a first conductive layer 505, a second conductive layer 515, and a dielectric layer 510 disposed between the two conductive layers 505 and 515. In an exemplary embodiment, the first conductive layer 505 is a rectangular lattice with a periodic structure consisting of conductive patch shape members in the vertical and horizontal direction connected by conductive branches. In an exemplary embodiment of the electromagnetic band gap structure 500, each patch shape member is identical, thus giving the first conductive layer 505 its periodic structure. The patch shape member 520, in an exemplary embodiment shown in FIG. 5, can be divided into unit cells. The patch shape member 520 shown in FIG. 5 has a 5×5 array of unit cells. Those of skill in the art will appreciate that dimensions of patch shape member 520 represent one example of a patch shape member, and numerous dimensions are possible for the patch shape members of the electromagnetic band gap structure 500, depending on the specific implementation parameters. The diagram 525 of patch shape member 520 shown in FIG. 5, illustrates the structure of this exemplary patch shape member. Each unit cell, like unit cell 530, of the patch shape member either is filled with a conductive material (solid) or is free of conductive material (void).

As shown in FIG. 5, the configuration of the patch shape member 520 can easily be expressed with digital symbols according to whether a unit is solid or void. A void unit cell, like unit cell 535, can be assigned a "0", and a solid unit cell, like unit cell 530, can be assigned a "1." Therefore, the configuration of patch shape member 520 can be expressed as binary sequence 540. Binary sequences, such as binary sequence 540, can easily be processed by the genetic algorithm 405 of the method of electromagnetic band gap structure synthesis 400.

While each individual patch shape member of an electromagnetic band gap structure, such as patch shape member 520, can exhibit a required stop band, it is the arrangement of multiple patch shape members that determines whether the required isolation level, or stop band floor, can be delivered by a particular electromagnetic band gap structure. While the stop band determines in what frequency range the electromagnetic band gap structure will suppress noise, the stop band floor determines the extent to which such noise will be suppressed. For many electronic device applications, precise functionality of the circuits can only be ensured by a particular amount of noise isolation. Thus, a proposed electromagnetic band gap structure may be evaluated for both its stop band and its stop band floor.

Figure 6:
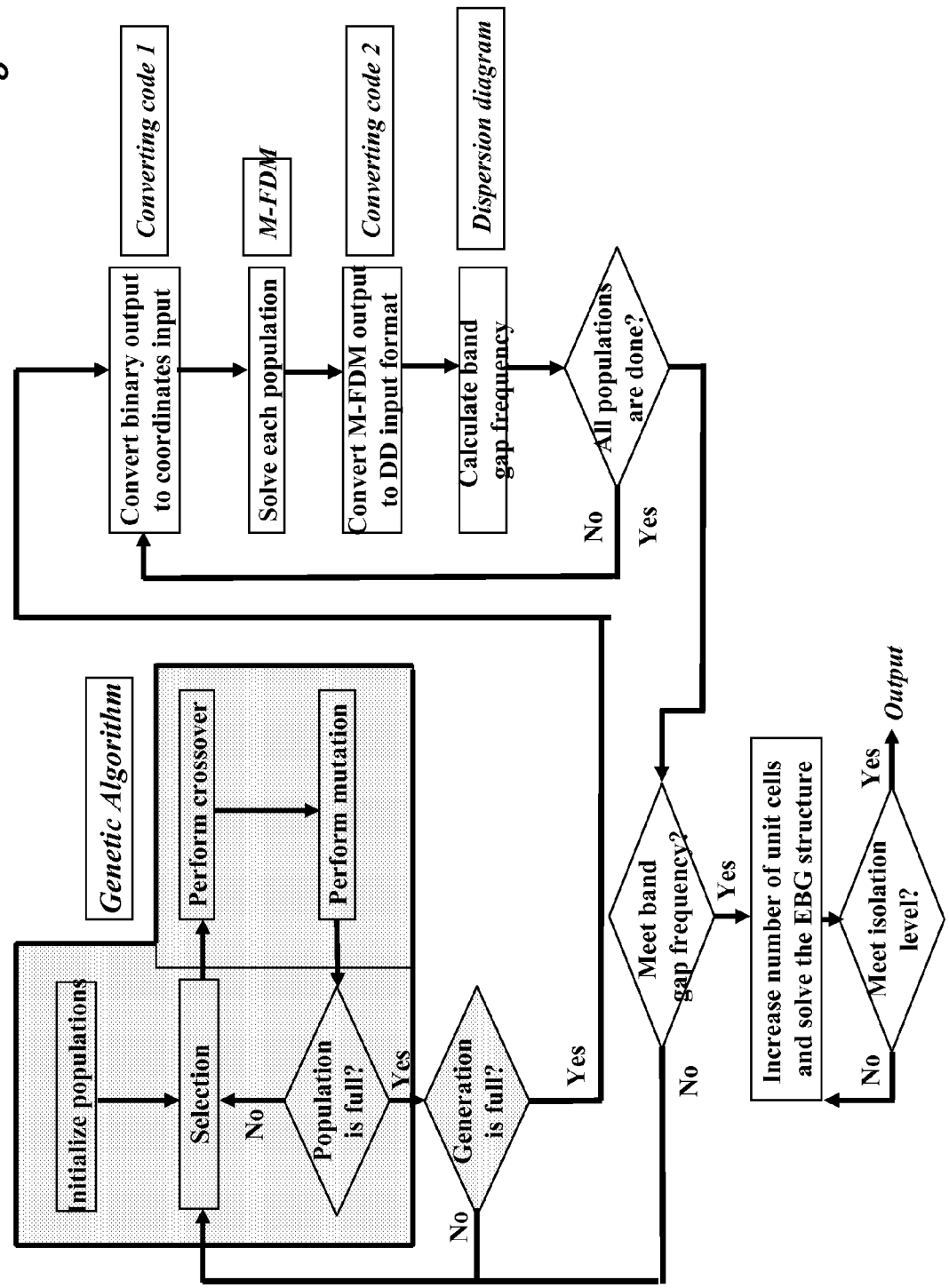
FIG. 6 is an illustration of a flow chart for a method of electromagnetic band gap structure synthesis 600 in accordance with an exemplary embodiment of the present invention, in which the proposed electromagnetic band gap structure is tested for a proper isolation level.

FIG. 6 is an illustration of a flow chart for a method of electromagnetic band gap structure synthesis 600 in accordance with an exemplary embodiment of the present invention, in which the proposed electromagnetic band gap structure is tested for a proper isolation level. The method of electromagnetic band gap structure synthesis 600 first involves the step of initializing the populations 610 of the genetic algorithm 605 with a group of patch shape members for each population. Once the populations have been initialized 610, the step of selection 615 can be performed on the patch shape members of the population. The step of selection 615 involves selecting a portion of an existing population to breed a new generation. Once the patch shape members of the population have been selected, the step of crossover 620 can be performed. In an exemplary embodiment, the step of crossover 620 constitutes a genetic operator in which the programming of the patch shape members of each population is varied. After the step of crossover 620, the step of mutation 625 can be performed on the children members of the parent population. In an exemplary embodiment, the step of mutation 625 involves the use of a genetic operator to maintain genetic diversity from one generation of a population to the next. Once each patch shape member of a population has been determined, selection can begin for the next population. After selection 615, crossover 620, and mutation 625 have been performed on each patch shape member of a population, conditional step 630 is executed to determine whether all populations for a generation have been modified by the genetic algorithm 605. The genetic algorithm will perform selection, crossover, and mutation on every population until conditional step 630 is satisfied and a new generation is full. Once every population has been modified and the generation is full, thus satisfying conditional step 630, the full generation of new populations can be output from the genetic algorithm 605.

In an exemplary embodiment of the method of electromagnetic band gap structure synthesis 600, the next step 640 involves converting the binary sequences of patch shape members output from the genetic algorithm 605 into a set of coordinates for each patch shape member. Once converted, the step of solving 645 can be performed such that each patch shape of each population is solved with an electrodynamics modeling technique. In the exemplary embodiment depicted in FIG. 6, the multilayer finite-difference (M-FDM) method is used to solve each patch shape member of the populations. For the exemplary embodiment depicted FIG. 6, the M-FDM method generates a set of response data, namely a set of impedance parameters, for each patch shape member. The set of response data can be used to determine the fitness of a particular patch shape member.

In the exemplary embodiment of method of electromagnetic band gap structure synthesis 600 depicted in FIG. 6, the set of response data are converted into a dispersion diagram (DD) format in step 650. Once the step of conversion into DD format 650 is complete, the step of calculating a fitness level 655 can be performed on each patch shape member of each population. The fitness level of a particular patch shape member is defined by a comparison of the DD format of the set of response data for that particular patch shape member to the set of desired characteristics for the electromagnetic band gap structure. The closer a patch shape member is to meeting the set of desired characteristics, the better the fitness level.

Steps 640, 645, 650, 655 are repeated for each patch shape member of each population until all the populations are complete, thus satisfying conditional step 660. Once conditional step 660 is satisfied (all populations have been evaluated), a determination can be made at conditional step 665 as whether any of the patch shape members of the population have a fitness level within a predetermined threshold. If none the patch shape members succeed in providing a fitness level within the predetermined tolerance amount (and condition step 665 is not satisfied), then the genetic algorithm 605 can be re-executed, using the existing populations, to create a new generation for evaluation. In other words, the existing populations can be reinserted into the selection step 615 of the genetic algorithm 605, and a new generation can be created.

If a particular patch shape member has a sufficient fitness level, then that patch shape member can be selected as the solution patch shape and conditional step 665 can be satisfied. In an exemplary embodiment, the patch shape member chosen as the solution patch shape member by conditional step 665 can be configured in an initial array of the electromagnetic band gap structure. The next step in the method of electromagnetic band gap structure synthesis 600 is to evaluate the initial array of the electromagnetic band gap structure 670 to determine the amount of isolation provided by the array. Subsequently, conditional step 675 determines whether the array provides the proper isolation level set forth in the set desired characteristics for the band gap structure. If the array provides the proper isolation level (i.e., the stop band floor is sufficient), then this array of copies of the solution patch shape member can be chosen as the final electromagnetic band gap structure design. If the array provides an insufficient level of isolation, and conditional step 675 is not satisfied, step 670 is repeated and the array is increased in dimension until a proper level of isolation is shown and conditional step 675 is satisfied.

Figure 7:
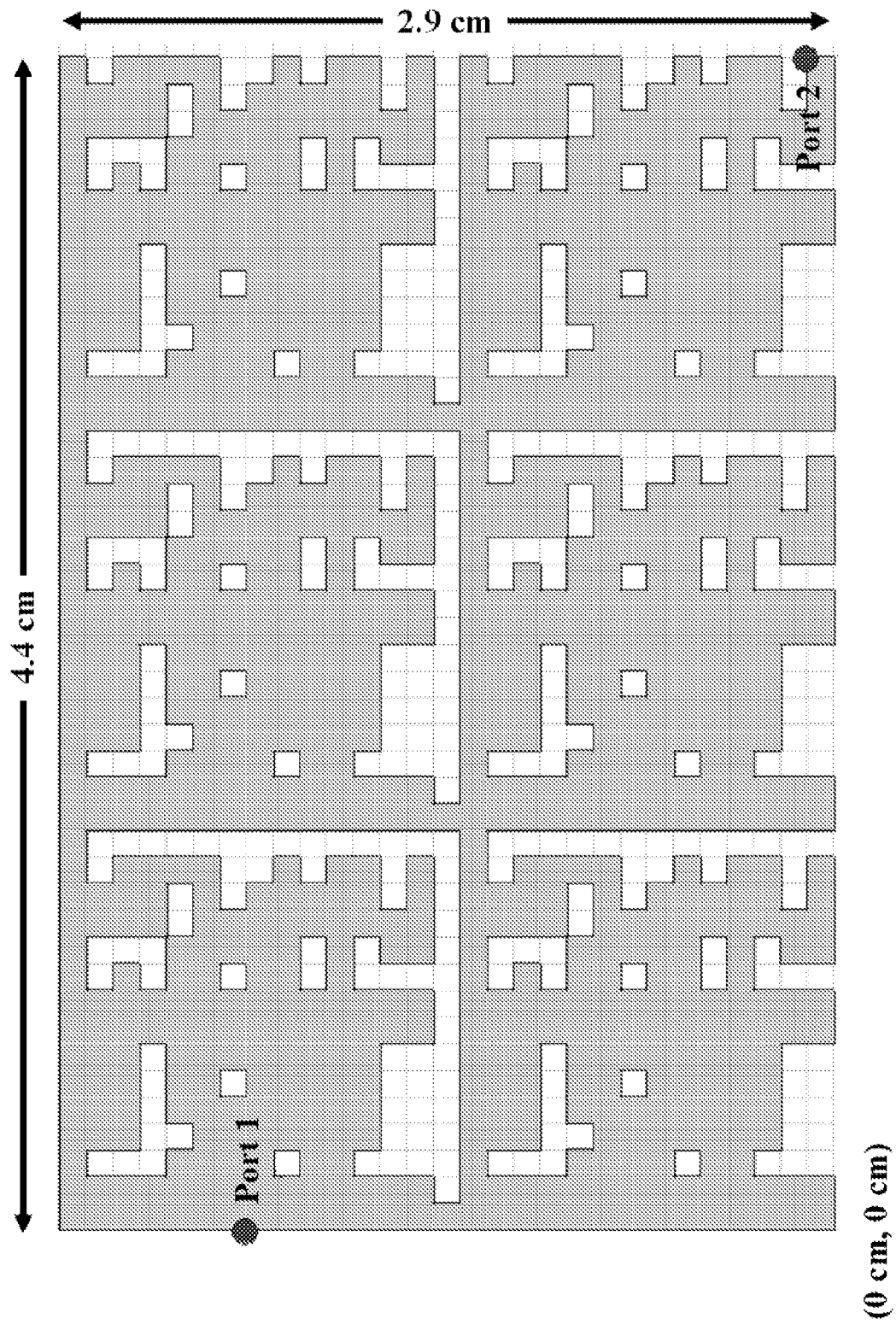
FIG. 7 is a schematic of an electromagnetic band gap structure layout 705 in accordance with an exemplary embodiment of the present invention.

FIG. 7 is a schematic of an electromagnetic band gap structure layout 705 in accordance with an exemplary embodiment of the present invention. In an exemplary embodiment, the output of the method of electromagnetic band gap structure synthesis is an electromagnetic band gap structure layout, such as layout 705. As shown in FIG. 7, the layout 705 is comprised of 2×3 array of six solution patch shape members. In the exemplary embodiment shown in FIG. 7, each patch shape member is identical. The total size of the array is shown as being 4.4 cm in length and 2.9 cm in width. Using this electromagnetic band gap structure layout 705, the actual electromagnetic band gap structure can be fabricated.

Figure 8:
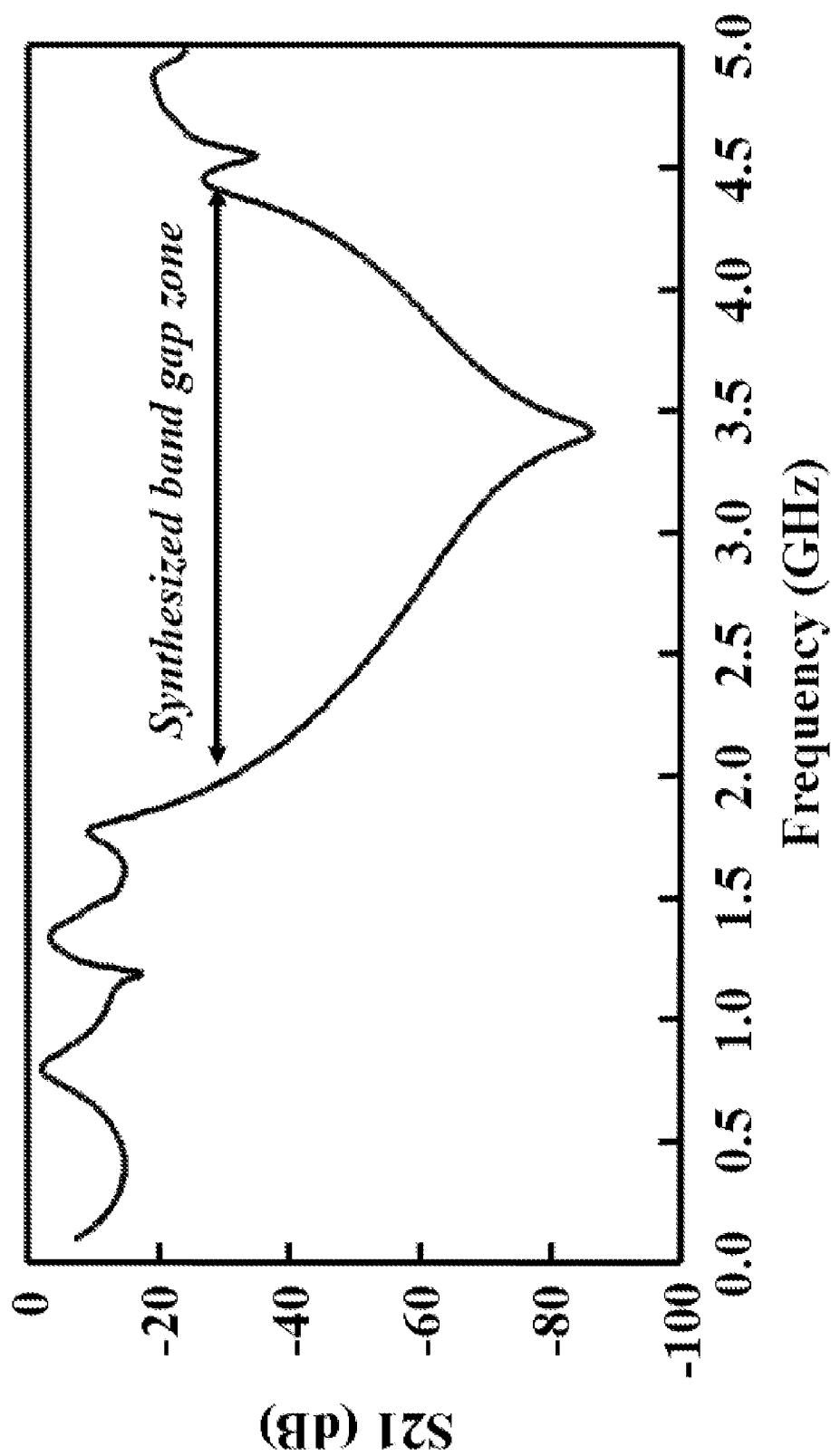
FIG. 8 is a graph 805 of an S-parameter evaluation of electromagnetic band gap structure layout 705 in accordance with an exemplary embodiment of the present invention.

FIG. 8 is a graph 805 of an S-parameter evaluation of electromagnetic band gap structure layout 705 in accordance with an exemplary embodiment of the present invention. A simulation can be run to evaluate electromagnetic band gap structure layout 705 to verify that is comports with the set of desired characteristics for the structure, including exhibiting a proper on-set frequency, offset frequency, and isolation level. The graph 805 shown in FIG. 8 plots the transmission coefficient (S-parameter, S21) against frequency to illustrate the simulated response of the electromagnetic band gap structure layout 705. As shown in graph 805, the layout 705 provides an on-set frequency around 2 GHz and an offset frequency of about 4.5 GHz. The isolation in the stop band ranges from around −40 dB to around −70 dB at its peak.

Figure 9:
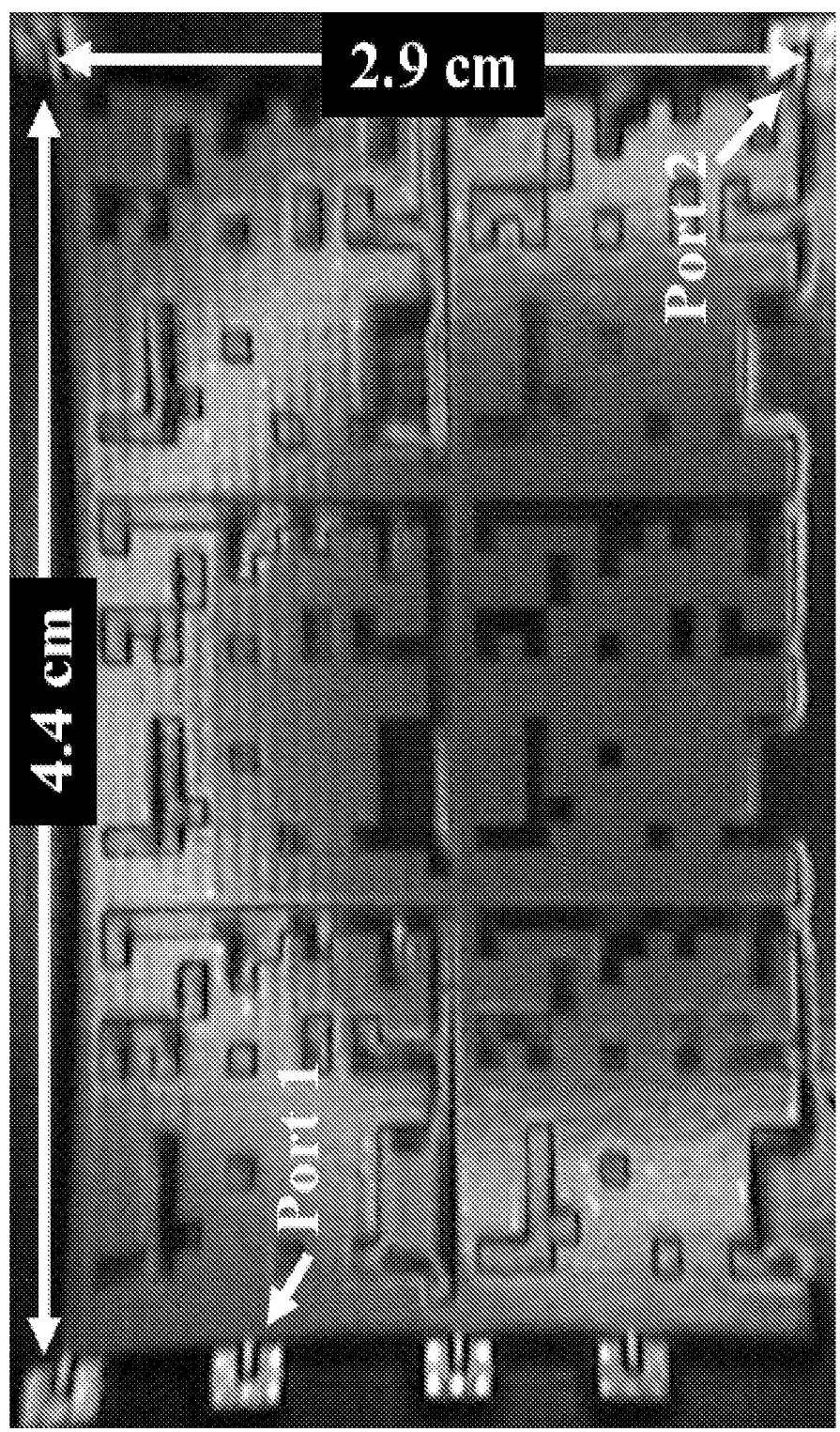
FIG. 9 is a photograph of an electromagnetic band gap structure 905 in accordance with an exemplary embodiment of the present invention.

FIG. 9 is a photograph of an electromagnetic band gap structure 905 in accordance with an exemplary embodiment of the present invention. The exemplary embodiment of electromagnetic band gap structure 905 was fabricated based on layout 705 shown in FIG. 7. As shown in FIG. 9, the void and solid pattern of the first conductive layer of the electromagnetic band gap structure follows the pattern of layout 705. Furthermore, the patch shape member chosen for electromagnetic band gap structure 905 is repeated six times in the 2×3 array. The electromagnetic band gap structure 905 can be created using numerous different fabrication techniques, including the conventional FR4 process. Furthermore, the input parameters gathered for the electromagnetic band gap structure 905 can be used to determine the parameters of fabrication. For example, and not limitation, the dielectric material can be FR4 with a relative permittivity ($\in_r$) around 4.4, a copper conductor with a conductivity ($\sigma_c$) around 5.8× 107 S/m, a dielectric loss tangent (tan δ) around 0.02.

Figure 10:
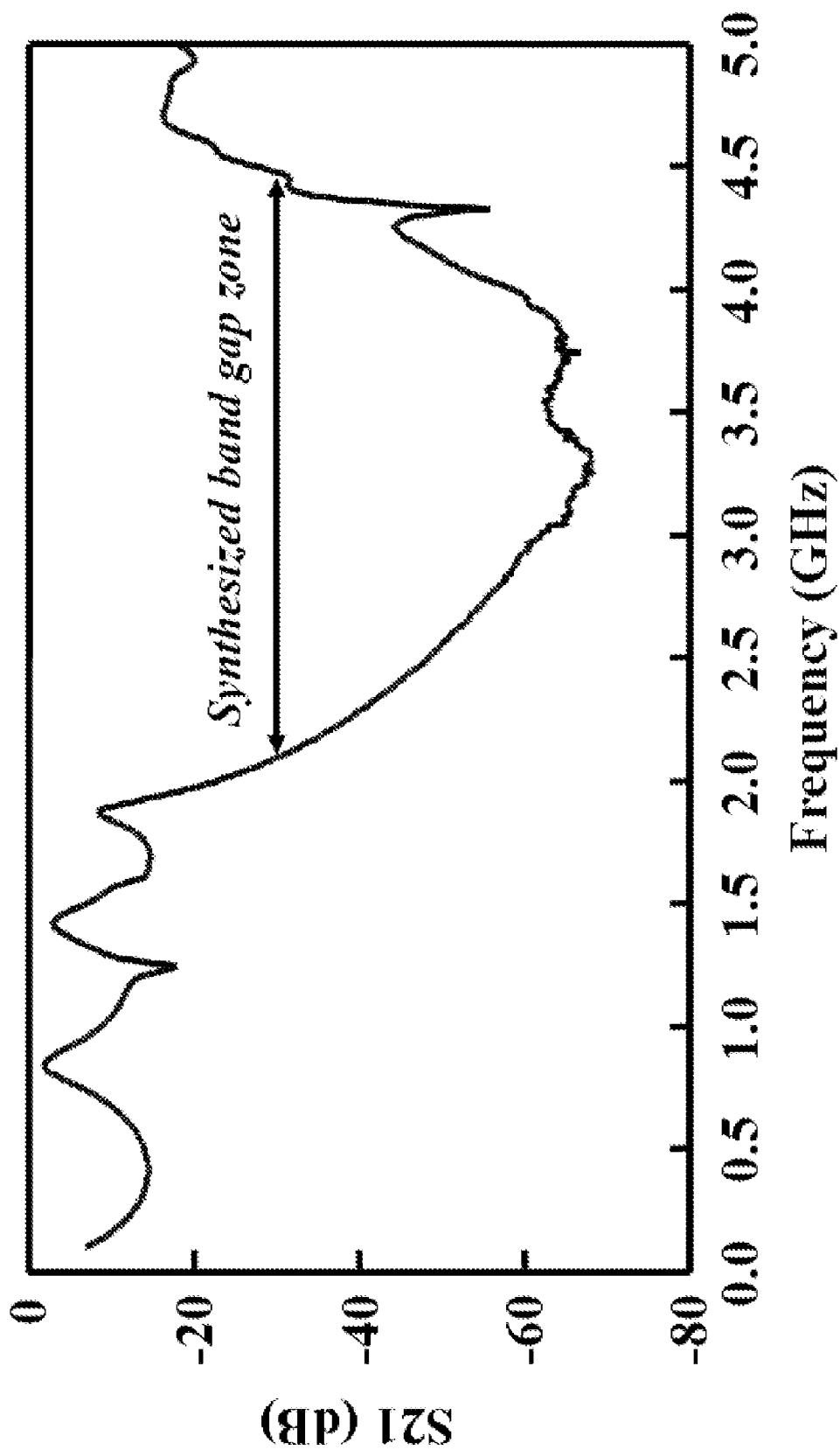
FIG. 10 is a graph 1005 of an S-parameter evaluation of electromagnetic band gap structure 905 in accordance with an exemplary embodiment of the present invention.

FIG. 10 is a graph 1005 of an S-parameter evaluation of electromagnetic band gap structure 905 in accordance with an exemplary embodiment of the present invention. Once simulated, the electromagnetic band gap structure 905 can be tested to verify that it comports with the set of desired characteristics, including exhibiting a proper on-set frequency, offset frequency, and stop band floor. Those of skill in the art will appreciate that numerous different methods and apparatus can be used to evaluate the electromagnetic band gap structure 905. For the exemplary embodiment of the electromagnetic band gap structure 905 graphed in FIG. 10, an Agilent Technologies PNA Series Network Analyzer (E8363B) was used to measure the transmission coefficient (S21). The graph shown in FIG. 10 plots the transmission coefficient (S parameter, S21) against frequency to illustrate the response of the electromagnetic band gap structure 905. The graph illustrates a response that sufficiently corresponds to the simulated result shown in graph 805 of FIG. 8. Furthermore, graph 1005 illustrates that the electromagnetic band gap structure 905 meets the set of desired characteristics provided for the structure as it provides an on-set frequency around 2 GHz and an offset frequency of about 4.5 GHz and the isolation in the stop band ranges from around −40 dB to around −90 dB at the peak of the stop band floor.

FIG. 11 is an illustration of a patch shape member for an electromagnetic band gap structure synthesized in accordance with an exemplary embodiment of the present invention and the corresponding dispersion diagram for the electromagnetic band gap structure layout. The electromagnetic band gap structure synthesized and shown in FIG. 11 is a one dimensional structure with a 14 mm×14 mm unit cell size and a target on-set frequency of 1.4 GHz. The dispersion diagram illustrates that the electromagnetic band gap structure layout provides the proper band gap response.

Figure 12:
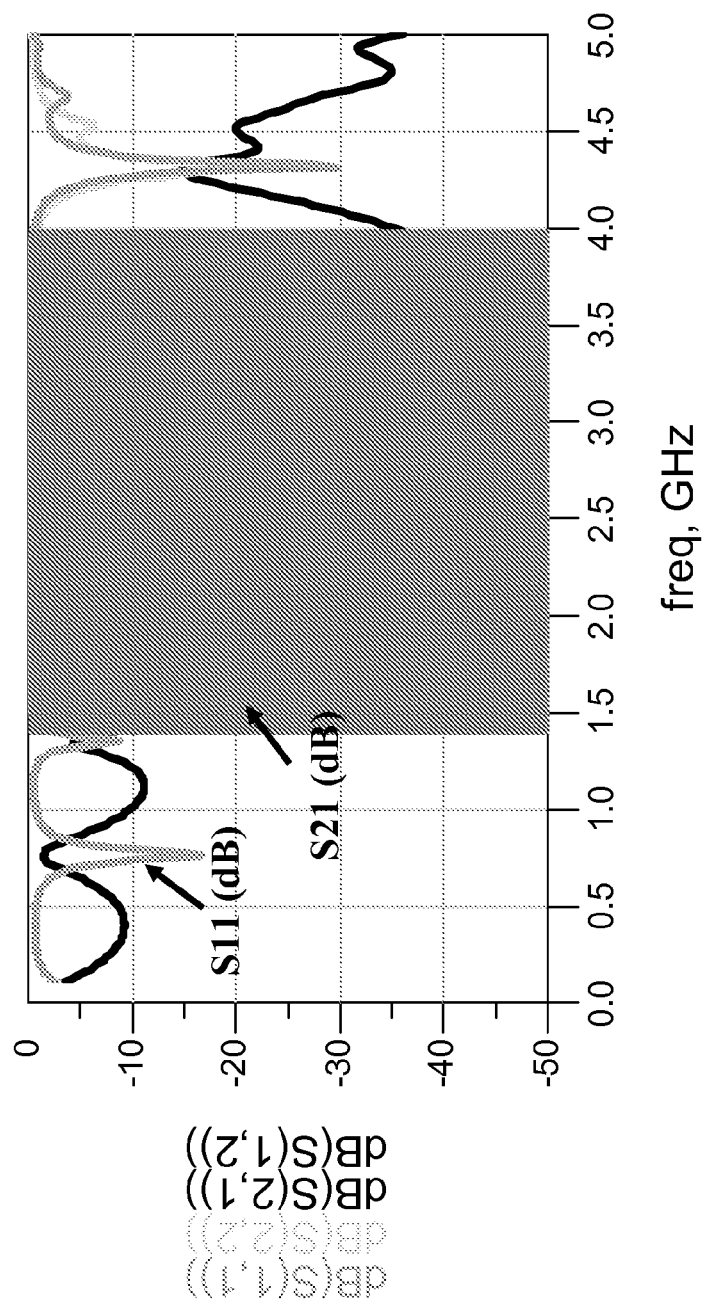
FIG. 12 is a graph of an S-parameter evaluation of electromagnetic band gap structure simulated in accordance with the electromagnetic band gap structure layout shown in FIG. 11.

FIG. 12 is a graph of an S-parameter evaluation of electromagnetic band gap structure simulated in accordance with the electromagnetic band gap structure layout shown in FIG. 11. As shown in FIG. 12, the electromagnetic band gap structure provides a band gap with the required on-set frequency of 1.4 GHz.

FIG. 13 is an illustration of a patch shape member for an electromagnetic band gap structure synthesized in accordance with an exemplary embodiment of the present invention and the corresponding dispersion diagram for the electromagnetic band gap structure layout. The electromagnetic band gap structure synthesized and shown in FIG. 13 is a one dimensional structure with a 14 mm×14 mm unit cell size and a target on-set frequency of 1 GHz. The dispersion diagram illustrates that the electromagnetic band gap structure layout provides the proper band gap response.

Figure 14:
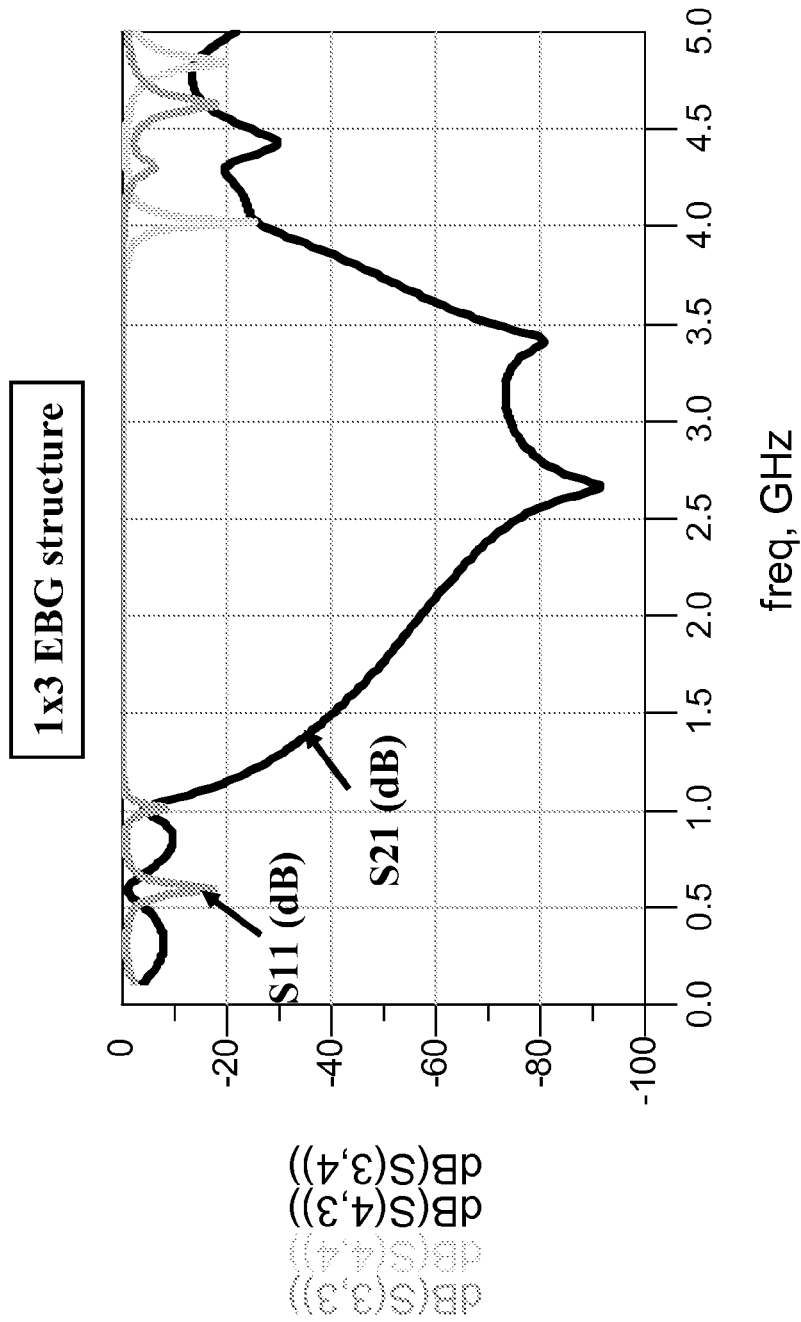
FIG. 14 is a graph of an S-parameter evaluation of electromagnetic band gap structure simulated in accordance with the electromagnetic band gap structure layout shown in FIG. 13.

FIG. 14 is a graph of an S-parameter evaluation of electromagnetic band gap structure simulated in accordance with the electromagnetic band gap structure layout shown in FIG. 13. As shown in FIG. 14, the electromagnetic band gap structure provides a band gap with the required on-set frequency of 1 GHz.

FIG. 15 is an illustration of a patch shape member for an electromagnetic band gap structure synthesized in accordance with an exemplary embodiment of the present invention and the corresponding dispersion diagram for the electromagnetic band gap structure layout. The electromagnetic band gap structure synthesized and shown in FIG. 15 is a one dimensional structure with a 14 mm×14 mm unit cell size and a target on-set frequency of 0.9 GHz. The dispersion diagram illustrates that the electromagnetic band gap structure layout provides the proper band gap response.

Figure 16:
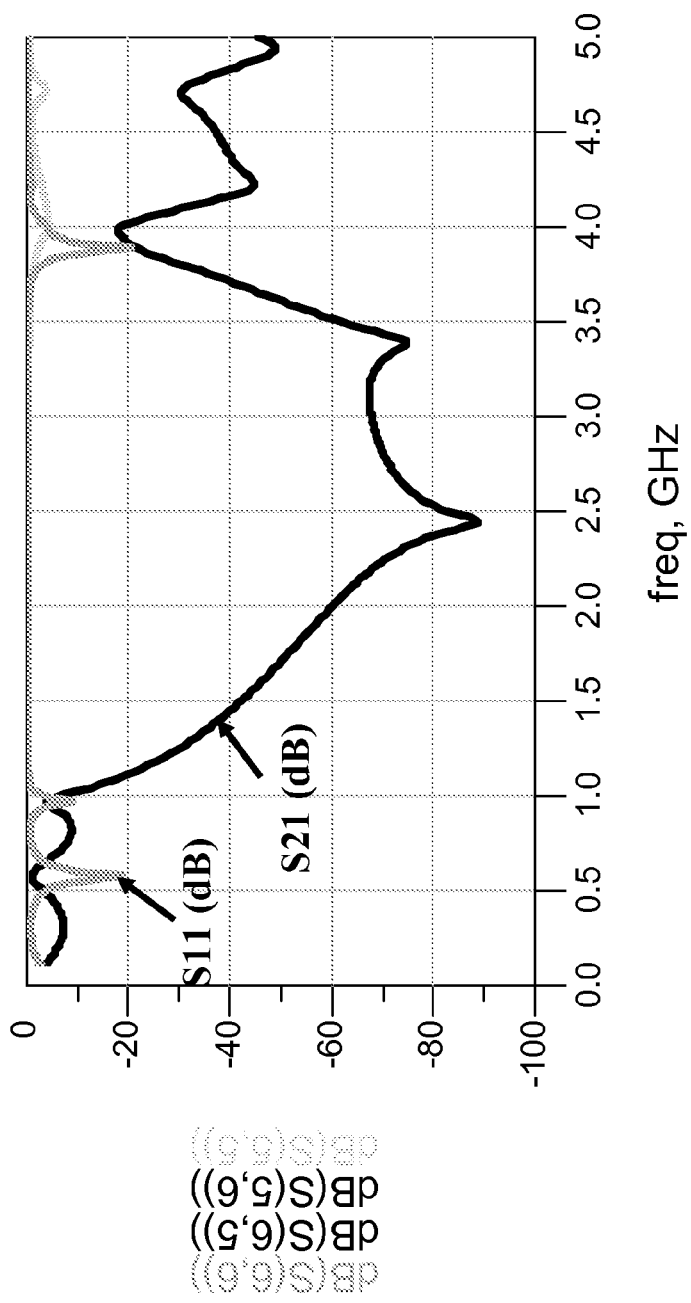
FIG. 16 is a graph of an S-parameter evaluation of electromagnetic band gap structure simulated in accordance with the electromagnetic band gap structure layout shown in FIG. 15.

FIG. 16 is a graph of an S-parameter evaluation of electromagnetic band gap structure simulated in accordance with the electromagnetic band gap structure layout shown in FIG. 15. As shown in FIG. 16, the electromagnetic band gap structure provides a band gap with the required on-set frequency of 0.9 GHz.

FIG. 17 is an illustration of a patch shape member for an electromagnetic band gap structure synthesized in accordance with an exemplary embodiment of the present invention and the corresponding dispersion diagram for the electromagnetic band gap structure layout. The electromagnetic band gap structure synthesized and shown in FIG. 17 is a one dimensional structure with a 14 mm×14 mm unit cell size and a target on-set frequency of 1.8 GHz. The dispersion diagram illustrates that the electromagnetic band gap structure layout provides the proper band gap response.

Figure 18:
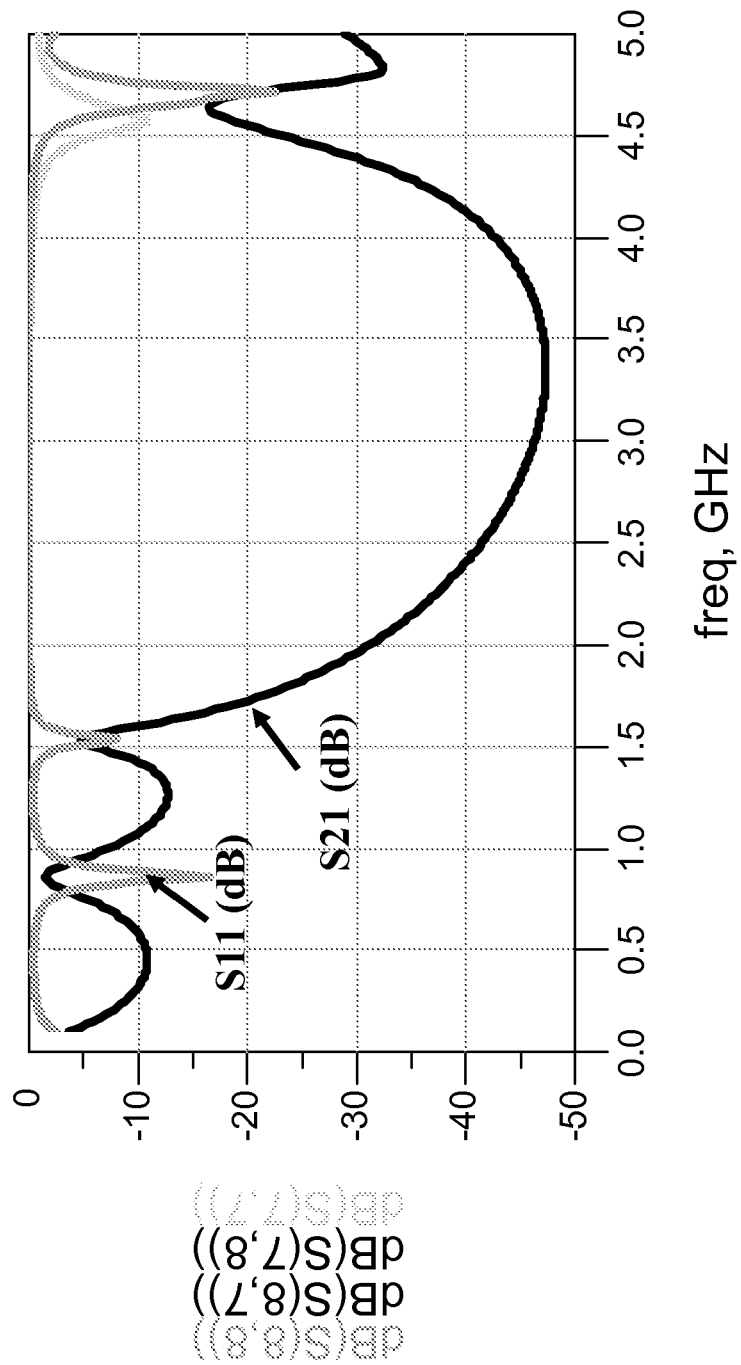
FIG. 18 is a graph of an S-parameter evaluation of electromagnetic band gap structure simulated in accordance with the electromagnetic band gap structure layout shown in FIG. 17.

FIG. 18 is a graph of an S-parameter evaluation of electromagnetic band gap structure simulated in accordance with the electromagnetic band gap structure layout shown in FIG. 17. As shown in FIG. 18, the electromagnetic band gap structure provides a band gap with the required on-set frequency of 1.8 GHz.

Figure 19:
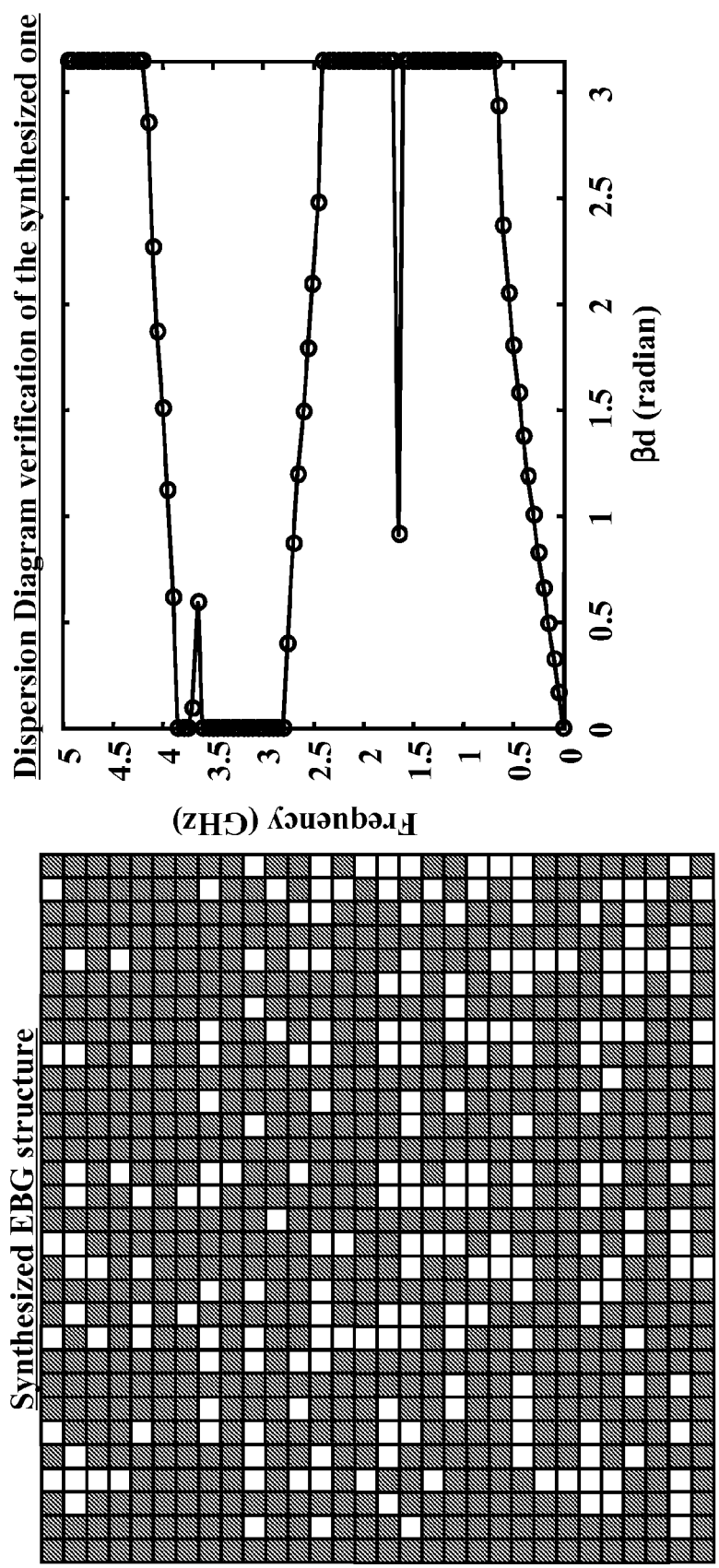
FIG. 19 is an illustration of a patch shape member for an electromagnetic band gap structure synthesized in accordance with an exemplary embodiment of the present invention and the corresponding dispersion diagram for the electromagnetic band gap structure layout.

FIG. 19 is an illustration of a patch shape member for an electromagnetic band gap structure synthesized in accordance with an exemplary embodiment of the present invention and the corresponding dispersion diagram for the electromagnetic band gap structure layout. The electromagnetic band gap structure synthesized and shown in FIG. 19 is a one dimensional structure with a 30 mm×30 mm unit cell size and a target on-set frequency of 0.7 GHz. The dispersion diagram illustrates that the electromagnetic band gap structure layout provides the proper band gap response.

Figure 20:
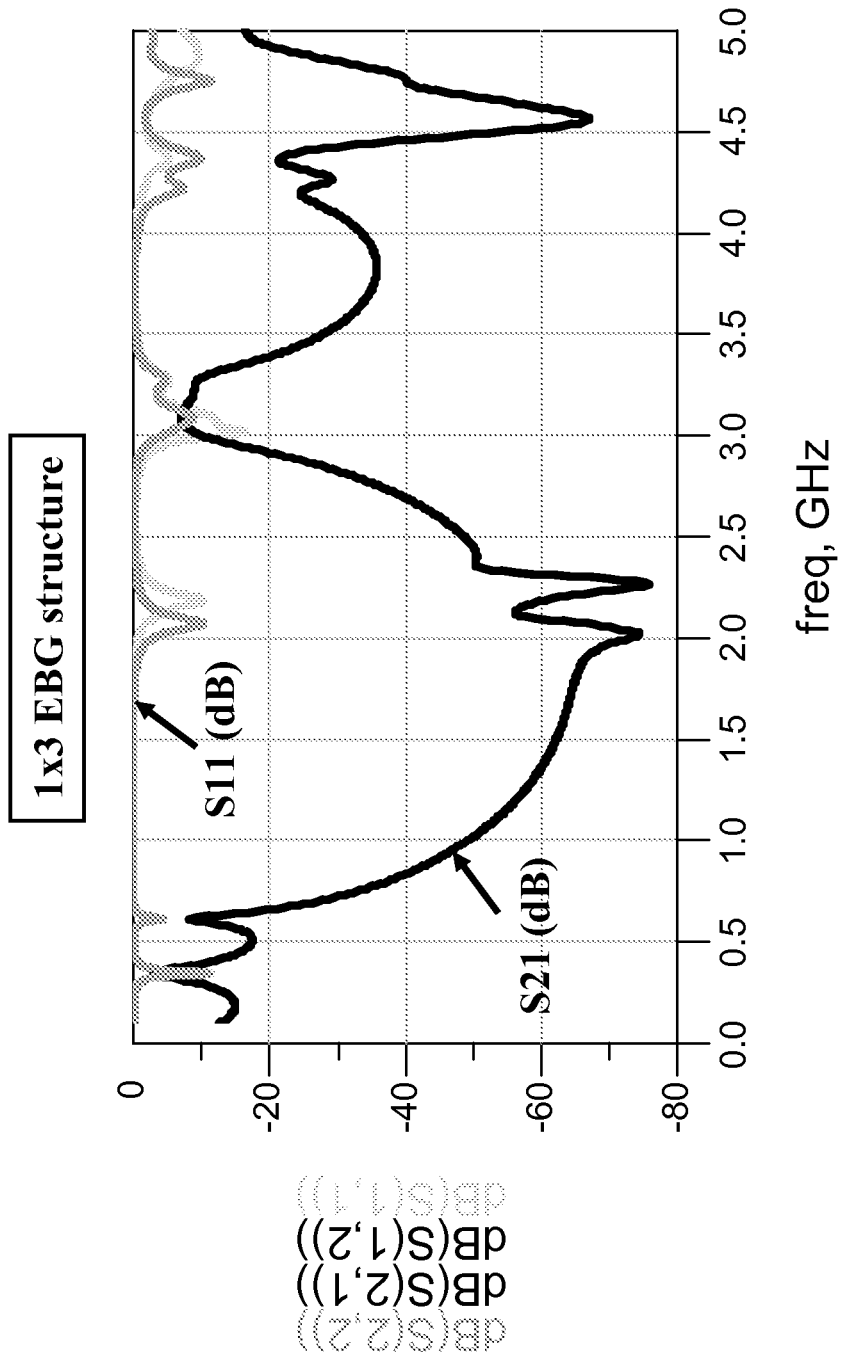
FIG. 20 is a graph of an S-parameter evaluation of electromagnetic band gap structure simulated in accordance with the electromagnetic band gap structure layout shown in FIG. 19.

FIG. 20 is a graph of an S-parameter evaluation of electromagnetic band gap structure simulated in accordance with the electromagnetic band gap structure layout shown in FIG. 19. As shown in FIG. 20, the electromagnetic band gap structure provides a band gap with the required on-set frequency of 0.7 GHz.

Figure 21:
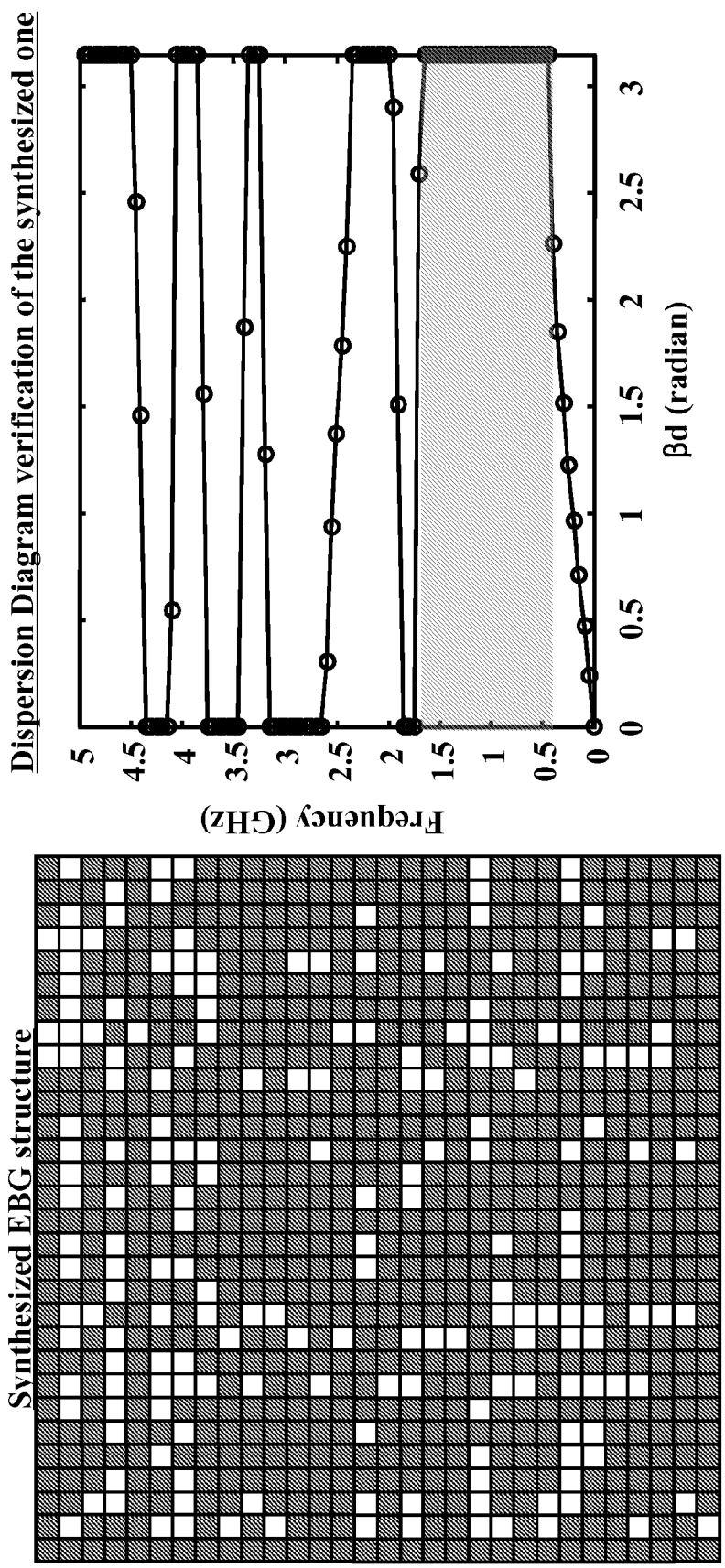
FIG. 21 is an illustration of a patch shape member for an electromagnetic band gap structure synthesized in accordance with an exemplary embodiment of the present invention and the corresponding dispersion diagram for the electromagnetic band gap structure layout.

FIG. 21 is an illustration of a patch shape member for an electromagnetic band gap structure synthesized in accordance with an exemplary embodiment of the present invention and the corresponding dispersion diagram for the electromagnetic band gap structure layout. The electromagnetic band gap structure synthesized and shown in FIG. 21 is a one dimensional structure with a 30 mm×30 mm unit cell size and a target on-set frequency of 0.4 GHz. The dispersion diagram illustrates that the electromagnetic band gap structure layout provides the proper band gap response.

Figure 22:
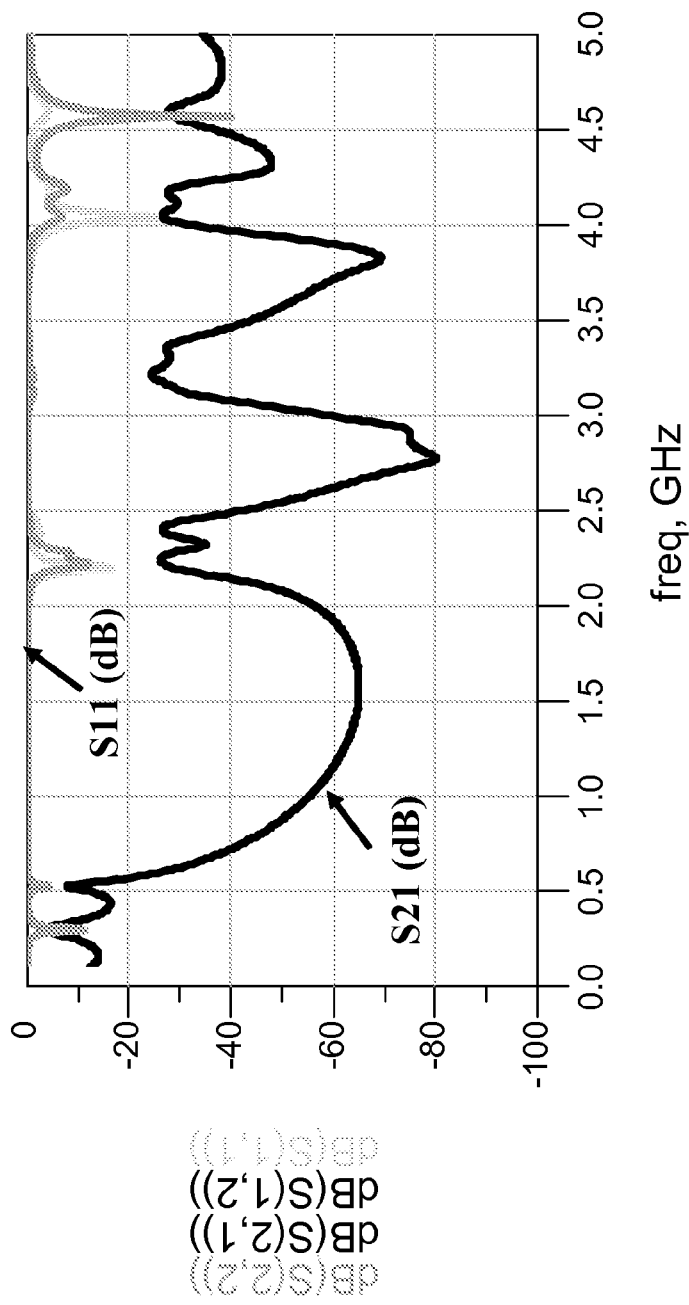
FIG. 22 is a graph of an S-parameter evaluation of electromagnetic band gap structure simulated in accordance with the electromagnetic band gap structure layout shown in FIG. 21.

FIG. 22 is a graph of an S-parameter evaluation of electromagnetic band gap structure simulated in accordance with the electromagnetic band gap structure layout shown in FIG. 21. As shown in FIG. 22, the electromagnetic band gap structure provides a band gap with the required on-set frequency of 0.4 GHz.

Figure 23B:
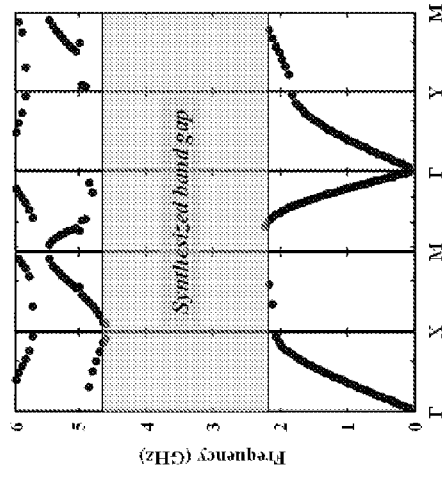
FIG. 23B is a graph of a dispersion diagram 2310 generated in accordance with an exemplary embodiment of the method of electromagnetic band gap structure synthesis.
Figure 23D:
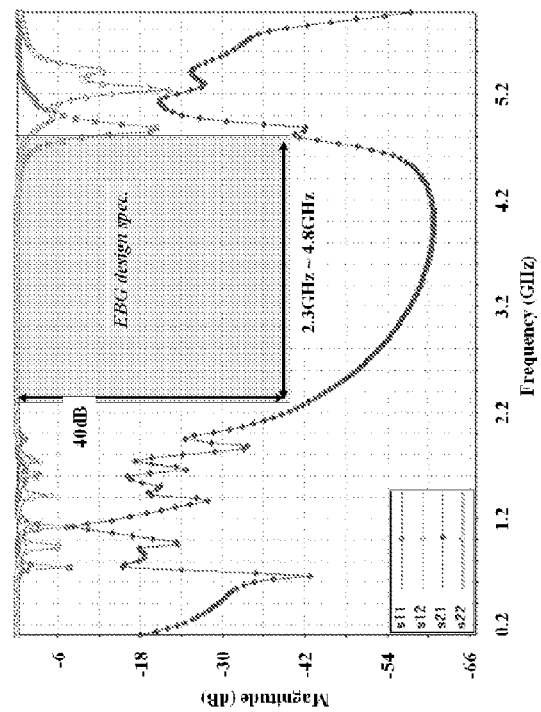
FIG. 23D is a graph 2320 of an S-parameter evaluation of electromagnetic band gap simulated in accordance with the electromagnetic band gap structure layout 2315 shown in FIG. 23C.
Figure 23A:
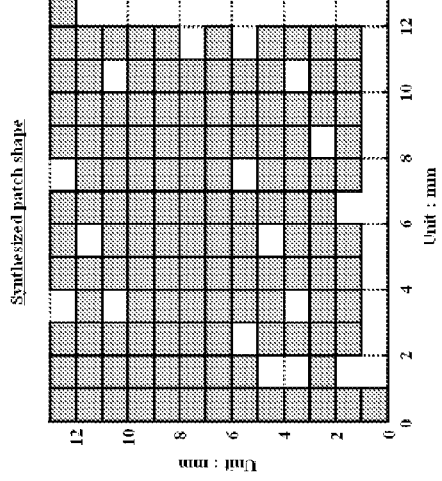
FIG. 23A is an illustration of a patch shape member 2305 synthesized in accordance with an exemplary embodiment of the method of electromagnetic band gap structure synthesis.

FIG. 23A is an illustration of a patch shape member 2305 synthesized in accordance with an exemplary embodiment of the method of electromagnetic band gap structure synthesis. The set of desired characteristics for an electromagnetic band gap structure gathered for the method of electromagnetic band gap structure synthesis 400 for patch shape member 2305 shown in FIG. 23A included the following: an on-set frequency of 2.3 GHz, an off-set frequency of 4.8 GHz, an isolation level target amount of at least 40 dB isolation over the stop band (2.3 GHz-4.8 GHz), and a tolerance for variation in the stop band of 300 MHz. In accordance with this set of desired characteristics for an electromagnetic band gap structure, an exemplary embodiment of the method of electromagnetic band gap structure synthesis was employed to create patch shape member 2305.

FIG. 23B is a graph of a dispersion diagram 2310 generated in accordance with an exemplary embodiment of the method of electromagnetic band gap structure synthesis. The dispersion diagram 2310 shown in FIG. 23B illustrates the band gap response of patch shape member 2305. As shown in dispersion diagram 2310, patch shape member 2305 provides a stop band between 2.3 GHz and 4.8 GHz. Additionally, dispersion diagram 2310 illustrates that the stop band occurs within the tolerance allotted for variation of 300 MHz, as neither the on-set frequency or the offset frequency vary from the desired amount by more than 300 MHz. Therefore, the dispersion diagram 2310 verifies that the patch shape member 2305 provides the proper stop band. In other words, the fitness level for patch shape member 2305 would be within a predetermined tolerance. The dispersion diagram 2310 does not verify, however, that the isolation level target amount of at least 40 dB isolation is achieved over the stop band (2.3 GHz-4.8 GHz) by the patch shape member 2305.

Figure 23C:
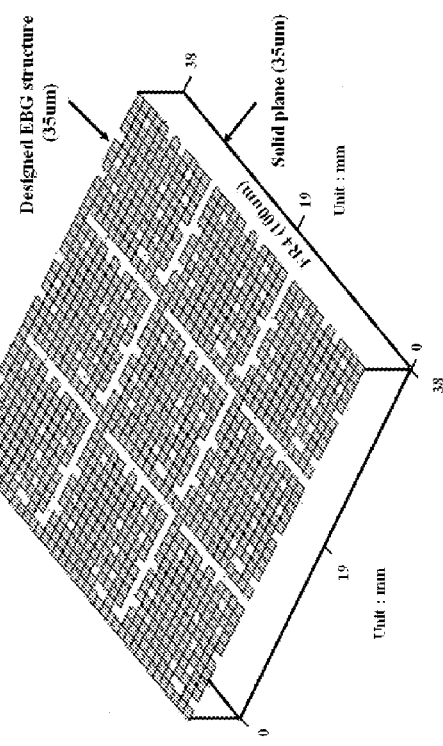
FIG. 23C is a layout for an electromagnetic band gap structure 2315 generated in accordance with an exemplary embodiment of the method of electromagnetic band gap structure synthesis.

FIG. 23C is a layout for an electromagnetic band gap structure 2315 generated in accordance with an exemplary embodiment of the method of electromagnetic band gap structure synthesis. In order to achieve the desired isolation level, in an exemplary embodiment, an array of copies of patch shape member 2305 can be created. In accordance with an exemplary embodiment of the method of electromagnetic band gap structure synthesis, an array is created and evaluated to determine whether the desired isolation level is achieved. The electromagnetic band gap structure layout 2315 shown in FIG. 23C provides the final layout in accordance with the output of the method electromagnetic band gap structure employed in this exemplary embodiment. As shown, the layout for electromagnetic band gap structure 2315 required at least three copies of patch shape member 2305 in both the horizontal and vertical direction to provide the desired isolation level.

FIG. 23D is a graph 2320 of an S-parameter evaluation of electromagnetic band gap simulated in accordance with the electromagnetic band gap structure layout 2315 shown in FIG. 23C. The graph 2320 shown in FIG. 23D illustrates the electromagnetic band gap structure layout 2315 provides the proper on-set frequency of 2.3 GHz and off-set frequency of 4.8 GHz. Furthermore, graph 2220 illustrates that the isolation level target amount of at least 40 dB isolation is achieved over this stop band (2.3 GHz-4.8 GHz). Therefore, the exemplary embodiment of the method of electromagnetic band gap structure synthesis employed for electromagnetic band gap structure layout 2315 was successful in achieving the original set of desired characteristics.

While the invention has been disclosed in its preferred forms, it will be apparent to those skilled in the art that many modifications, additions, and deletions can be made therein without departing from the spirit and scope of the invention and its equivalents as set forth in the following claims.

What is claimed is:

1. A method of electromagnetic band gap structure synthesis comprising the steps of:
    providing a set of desired characteristics for an electromagnetic band gap structure;
    generating a plurality of populations of a plurality of patch shape members with a genetic algorithm routine;
    solving one or more of the plurality of patch shape members of the plurality of populations with an electrodynamics modeling technique;
    converting the output of the electrodynamics modeling technique into a set of response data for one or more of the plurality of patch shape members for one or more of the plurality of populations;
    calculating a fitness level for one or more of the plurality of sets of response data in comparison to the set of desired characteristics for the electromagnetic band gap structure, including evaluating the one or more of the plurality of sets of response data to determine whether an isolation level has reached a target amount;
    determining whether the fitness level of one of the plurality of patch shape members is within a predetermined tolerance; and
    if none of the plurality of patch shape members provides a fitness level within the predetermined tolerance, then repeating the steps of generating, solving, converting, calculating, and determining.

2. The method of electromagnetic band gap structure synthesis of claim 1, wherein the set of desired characteristics comprises an on-set frequency of a band gap and an offset frequency of the band gap.

3. The method of electromagnetic band gap structure synthesis of claim 1, wherein the step of generating a plurality of populations of a plurality of patch shape members with a genetic algorithm includes initializing a plurality of populations, wherein the number of populations initialized ranges from around 4 to around 30.

4. The method of electromagnetic band gap structure synthesis of claim 1, wherein the step of generating a plurality of populations of a plurality of patch shape members with a genetic algorithm includes selecting around 50% of the plurality of patch shape members from each population for modification.

5. The method of electromagnetic band gap structure synthesis of claim 1, wherein the step of generating a plurality of populations of a plurality of patch shape members with a genetic algorithm includes performing a crossover operation on a portion of the plurality of patch shape members.

6. The method of electromagnetic band gap structure synthesis of claim 1, wherein the step of generating a plurality of populations of a plurality of patch shape members with a genetic algorithm includes performing a mutation operation on a portion of the plurality of patch shape members.

7. The method of electromagnetic band gap structure synthesis of claim 1, further comprising the step of determining that no patch shape member is capable of providing a fitness level within the predetermined tolerance.

8. The method of electromagnetic band gap structure synthesis of claim 1, further comprising the steps of:
    choosing one of the plurality of patch shape members with a fitness level within the predetermined tolerance as a solution patch shape;
    generating an electromagnetic band gap array made up of at least two copies of the solution patch shape;
    evaluating the electromagnetic band gap array to determine whether an isolation level has reached a target amount;
    if the isolation level has not reached the target amount, repeating the step of generating by adding at least one copy of the solution patch shape to the electromagnetic band gap array; and
    choosing the electromagnetic band gap array as a solution electromagnetic band gap structure when the isolation level reaches the target amount.

9. The method of electromagnetic band gap structure synthesis of claim 1, wherein the predetermined tolerance is a frequency range.

10. The method of electromagnetic band gap structure synthesis of claim 2, wherein the predetermined tolerance is an amount of frequency by which the on-set frequency may vary from that set forth in the set of desired characteristics.

11. The method of electromagnetic band gap structure synthesis of claim 1, wherein the electrodynamics modeling technique is a multilayer finite-difference (M-FDM) technique.

12. The method of electromagnetic band gap structure synthesis of claim 1, wherein the set of response data includes a set of impedance parameters.

13. The method of electromagnetic band gap structure synthesis of claim 1, wherein the step of calculating a fitness level for each set of response data involves comparing a dispersion diagram to the set of desired characteristics for an electromagnetic band gap structure.

14. An electromagnetic band gap synthesizing system comprising:
    a processor and memory;
    an input parameter unit for receiving a set of desired characteristics for an electromagnetic band gap structure, wherein the input parameter unit is stored on the memory and configured to be executed by the processor;
    a genetic algorithm unit for generating a plurality of populations of a plurality of patch shape members, wherein the genetic algorithm unit is stored on the memory and configured to be executed by the processor;
    a solving unit for solving one or more of the plurality of patch shape members of one or more the plurality of populations with an electrodynamics modeling technique, wherein the solving unit is stored on the memory and configured to be executed by the processor;
    a converting unit for converting the output of the electrodynamics modeling technique into a set of response data for one or more of the plurality of patch shape members for one or more of the plurality of populations, wherein the converting unit is stored on the memory and configured to be executed by the processor;

a calculating unit for calculating a fitness level for one or more of the sets of response data in comparison to the set of desired characteristics for the electromagnetic band gap structure, including evaluating the one or more of the plurality of sets of response data to determine whether an isolation level has reached a target amount, wherein the calculating unit is stored on the memory and configured to be executed by the processor;

an evaluation unit for determining whether the fitness level of one of the plurality of patch shape members is within a predetermined tolerance, wherein the evaluation unit is stored on the memory and configured to be executed by the processor; and an iteration unit in communication with the genetic algorithm unit for providing the plurality of populations of the plurality of patch shape members to the genetic algorithm unit if none of the plurality of patch shape members provides a fitness level within the predetermined tolerance, wherein the iteration unit is stored on the memory and configured to be executed by the processor.

15. The electromagnetic band gap synthesizing system of claim 14, wherein the genetic algorithm unit initializes a plurality of populations, wherein the number of populations initialized ranges from around 4 to around 30.

16. The electromagnetic band gap synthesizing system of claim 14, wherein the genetic algorithm units selects around 50% of the plurality of patch shape members from each population for modification.

17. The electromagnetic band gap synthesizing system of claim 14, wherein the genetic algorithm unit performs a crossover operation on a portion of the plurality of patch shape members.

18. The electromagnetic band gap synthesizing system of claim 14, wherein the genetic algorithm unit performs a mutation operation on a portion of the plurality of patch shape members.

19. The electromagnetic band gap synthesizing system of claim 14, wherein the set of desired characteristics comprise an on-set frequency of a band gap, an offset frequency of the band gap, and an isolation level.

* * * * *